United States Patent
Kosuda et al.

(10) Patent No.: US 7,265,520 B2
(45) Date of Patent: Sep. 4, 2007

(54) ELECTRONIC APPARATUS AND METHOD OF CONTROLLING THE ELECTRONIC APPARATUS

(75) Inventors: Tsukasa Kosuda, Matsumoto (JP); Norimitsu Baba, Shimosuwa-machi (JP); Hajime Kurihara, Shimosuwa-machi (JP); Motomu Hayakawa, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 498 days.

(21) Appl. No.: 10/343,524

(22) PCT Filed: Aug. 10, 2001

(86) PCT No.: PCT/JP01/06921

§ 371 (c)(1),
(2), (4) Date: Jan. 31, 2003

(87) PCT Pub. No.: WO02/14960

PCT Pub. Date: Feb. 21, 2002

(65) Prior Publication Data

US 2003/0146736 A1 Aug. 7, 2003

(30) Foreign Application Priority Data

Aug. 11, 2000 (JP) ............... 2000-245043
Sep. 19, 2000 (JP) ............... 2000-284266
Jul. 30, 2001 (JP) ............... 2001-230521
Jul. 30, 2001 (JP) ............... 2001-230522

(51) Int. Cl.
*H01M 10/46* (2006.01)

(52) U.S. Cl. .................................. 320/149

(58) Field of Classification Search ................ 320/108, 320/109, 137, 149, 160, 162, 166, 124, 127, 320/128, 135; 348/372, 333; 396/203
See application file for complete search history.

(56) References Cited

U.S. PATENT DOCUMENTS

| 4,307,449 A | | 12/1981 | Strubin | 73/291 |
|---|---|---|---|---|
| 4,547,770 A | * | 10/1985 | Suzuki et al. | 340/636.1 |
| 5,842,061 A | * | 11/1998 | Nakajima et al. | 396/203 |
| 6,060,862 A | * | 5/2000 | Sase et al. | 320/132 |
| 6,072,752 A | | 6/2000 | Igarashi et al. | 368/80 |
| 6,075,340 A | | 6/2000 | Koenck | 320/112 |
| 6,144,622 A | | 11/2000 | Berney | 368/204 |
| 6,205,091 B1 | | 3/2001 | Rudolph | 368/205 |
| 6,346,670 B1 | * | 2/2002 | Fujii et al. | 136/252 |
| 6,396,407 B1 | * | 5/2002 | Kobayashi | 340/636.12 |
| 2001/0008424 A1 | * | 7/2001 | Higuchi et al. | 348/372 |

FOREIGN PATENT DOCUMENTS

| EP | 0 488 354 | 6/1992 |
|---|---|---|
| EP | 0 709 943 | 5/1996 |
| EP | 0 713 101 | 5/1996 |
| EP | 0 818 719 | 1/1998 |
| EP | 0 855 633 | 7/1998 |
| EP | 0 909 996 | 4/1999 |
| EP | 0 982 637 | 3/2000 |
| JP | 7-241043 | 9/1995 |
| JP | 11-289677 | 10/1999 |
| JP | 2000-116013 | 4/2000 |
| WO | WO98 33098 | 7/1998 |
| WO | WO00/42673 | 7/2000 |
| WO | WO 02/014960 | 2/2002 |

* cited by examiner

*Primary Examiner*—Edward Tso
(74) *Attorney, Agent, or Firm*—Rosalio Haro

(57) ABSTRACT

An electronic watch in which the display on a liquid crystal display 236 is prohibited when the detected output voltage of a secondary battery 220 drops to a first predefined voltage. An initialization process is performed when the detected voltage of the secondary battery 220 drops to a second voltage lower than the first voltage, and the display on the liquid crystal display unit 236 is restarted when the detected voltage of the secondary battery 220 rises to a third voltage not lower than the first voltage after having reached the second voltage.

11 Claims, 18 Drawing Sheets

FIG. 4

| DETECTION LEVEL DATA | MINIMUM VOLTAGE (V) | MAXIMUM VOLTAGE (V) | OPERATING CONDITION |
|---|---|---|---|
| 0 | 1 | 1.2 | |
| 1 | 1.2 | 1.4 | |
| 2 | 1.4 | 1.6 | |
| 3 | 1.6 | 1.8 | |
| 4 | 1.8 | 2 | |
| 5 | 2 | 2.2 | |
| 6 | 2.2 | 2.4 | |
| 7 | 2.4 | 2.6 | |
| 8 | 2.6 | 2.8 | |
| 9 | 2.8 | 3 | INITIALIZATION |
| 10 | 3 | 3.2 | DISPLAY OFF |
| 11 | 3.2 | 3.4 | DISPLAY ON |
| 12 | 3.4 | 3.6 | |
| 13 | 3.6 | 3.8 | |
| 14 | 3.8 | 4 | |
| 15 | 4 | 4.2 | |

FIG. 7

| DETECTION LEVEL DATA | MINIMUM VOLTAGE (V) | MAXIMUM VOLTAGE (V) | OPERATING CONDITION |
|---|---|---|---|
| 0 | 1 | 1.2 | |
| 1 | 1.2 | 1.4 | |
| 2 | 1.4 | 1.6 | |
| 3 | 1.6 | 1.8 | |
| 4 | 1.8 | 2 | |
| 5 | 2 | 2.2 | |
| 6 | 2.2 | 2.4 | |
| 7 | 2.4 | 2.6 | |
| 8 | 2.6 | 2.8 | |
| 9 | 2.8 | 3 | DISPLAY OFF (WHEN VOLTAGE DROPS) |
| 10 | 3 | 3.2 | INITIALIZATION AND DISPLAY ON (WHEN BEING CHARGED) |
| 11 | 3.2 | 3.4 | |
| 12 | 3.4 | 3.6 | |
| 13 | 3.6 | 3.8 | |
| 14 | 3.8 | 4 | |
| 15 | 4 | 4.2 | |

FIG. 10

| DETECTION LEVEL DATA | MINIMUM VOLTAGE (V) | MAXIMUM VOLTAGE (V) | OPERATING CONDITION |
|---|---|---|---|
| 0 | 1 | 1.2 | |
| 1 | 1.2 | 1.4 | |
| 2 | 1.4 | 1.6 | |
| 3 | 1.6 | 1.8 | |
| 4 | 1.8 | 2 | |
| 5 | 2 | 2.2 | |
| 6 | 2.2 | 2.4 | |
| 7 | 2.4 | 2.6 | |
| 8 | 2.6 | 2.8 | |
| 9 | 2.8 | 3 | DISPLAY OFF, INITIALIZATION AND DISPLAY ON (WHEN KEPT BEING CHARGED FOR A PREDETERMINED TIME) |
| 10 | 3 | 3.2 | |
| 11 | 3.2 | 3.4 | |
| 12 | 3.4 | 3.6 | |
| 13 | 3.6 | 3.8 | |
| 14 | 3.8 | 4 | |
| 15 | 4 | 4.2 | |

FIG. 19

| TERMINAL VOLTAGE Ev(V) | LEVEL | NOT BEING CHARGED, NORMAL OPERATION | BEING CHARGED | |
|---|---|---|---|---|
| 3.81~ (24mAH~) | 15 | ▮ | ▮ SB1 | ▮ SB1 |
| 3.61~ (18mAH~) | 14 | | | |
| 3.42~ (13mAH~) | 13 | ▮ | ▮ SB2 | ▮ SB2 |
| 3.23~ (7mAH~) | 12 | | | |
| 3.04~ (1.5mAH~) | 11 | ▯ | ▯ SB3 | ▯ SB3 |
| 2.85~ | 10 | ▯ | ▯ SB4 | ▯ SB4 |
| 2.66~ | 9 | | | |
| CHARGING METHOD | — | — | HALF | FULL |
| TABLE | | TA | TB | TC |

NUMBER OF DATE STILL USABLE UNDER NORMAL CONDITIONS: 22 DAYS, 14 DAYS

ELECTRONIC APPARATUS AND METHOD OF CONTROLLING THE ELECTRONIC APPARATUS

TECHNICAL FIELD

The present invention relates to an electronic apparatus having a secondary battery as a power source and a method of controlling such an electronic apparatus or, in particular, to a technique for operation control and display control of the electronic apparatus based on the voltage of the secondary battery.

BACKGROUND ART

In conventional compact portable electronic apparatuses, the secondary battery (or a primary battery) is often used as a power source for reducing both the size and weight.

A power source such as a secondary battery generally has a high internal resistance. Unless some measures are taken, therefore, the compact portable electronic apparatuses having this type of power source are liable to develop a malfunction or become inoperative due to the voltage drop across the high internal resistance of the power supply when the power supply voltage is lowered. Such compact portable electronic apparatuses are inconvenient to handle for the user.

In order to prevent the malfunction, these compact portable electronic apparatuses have been configured in such a manner that the system data is initialized or the user is urged to perform the charging operation in the case where the source voltage drops below a predetermined threshold level. The source voltage of the compact portable electronic apparatuses undergoes a small change in various processes.

Assuming that the threshold voltage is constant, therefore, depending on the operating conditions, the source voltage is reduced below the threshold level temporarily and the system data are initialized without the knowledge of the user or the screen display for urging the initialization or charging is repeated often to the inconvenience of the user.

DISCLOSURE OF THE INVENTION

The object of the present invention is to provide an electronic apparatus and a method of controlling the electronic apparatus which obviate the inconveniences caused by the variations of the source voltage described above and which can be handled more conveniently by the user.

In order to achieve this object, according to one aspect of this invention, there is provided: an electronic apparatus comprising a power supply unit; a display unit supplied with power from the power supply unit; a voltage detection unit for detecting the output voltage of the power supply unit; a display prohibition unit for prohibiting the display on the display unit when the output voltage of the power supply unit detected by the voltage detection unit decreases to a first voltage; an initialization unit for performing the initialization process when the output voltage of the power supply unit detected by the voltage detection unit drops to a second voltage lower than the first voltage; and a display permission unit for restarting the display on the display unit when the output voltage of the power supply unit detected by the voltage detection unit drops to the second voltage and then rises to a third voltage not lower than the first voltage.

With these electronic apparatuses, the situation can be avoided in which initialization is performed without the knowledge of the user.

In a preferable form, an electronic apparatus further comprises an information storage unit for storing the system information or the watch information and providing them to a control unit of the electronic apparatus, and the second voltage is set to a level not lower than the voltage at which the information storage unit is capable of storing and holding the system information or the watch information, as the case may be.

In a preferable form, an electronic apparatus comprises a nonvolatile storage unit for storing the system information or the watch information and an information storage unit for storing the system information or the watch information and providing them to a control unit of the electronic apparatus and the initialization unit performs the initialization process by transferring the system information or the watch information from the nonvolatile storage unit to the information storage unit.

According to another aspect of the invention, there is provided an electronic apparatus comprising a chargeable power supply unit, a display unit supplied with power from the power supply unit for display, a charge detection unit for determining whether the power supply unit is being charged or not, a voltage detection unit for detecting the output voltage of the power supply unit, a display prohibition unit for prohibiting the display on the display unit in the case where the output voltage of the power supply unit detected by the voltage detection unit decreases to a first voltage, and an initialization unit for performing the initialization process in the case where the result of determination by the charge detection unit and the result of detection by the voltage detection unit meet predetermined conditions after prohibition of the display on the display unit.

With this electronic apparatus, the initialization process is performed always after the disappearance of the display on the display unit, and therefore the initialization without the knowledge of the user is avoided.

In a preferable form, the initialization unit performs the initialization process, after the prohibition of the display on the display unit, when the charge detection unit determines that the power supply unit is being charged and the output voltage of the power supply unit detected by the voltage detection unit has reached the second voltage not lower than the first voltage.

In this case, the apparatus may comprise a display permission unit for restarting the display on the display unit when the initialization process is performed by the initialization unit.

Instead of this, the apparatus may comprise a display permission unit for restarting the display on the display unit when the output voltage of the power supply unit detected by the voltage detection unit reaches a third voltage not less than the second voltage after the initialization processing by the initialization unit.

In another preferable form, the initialization unit performs the initialization process, after the prohibition of the display on the display unit, when the charge detection unit determines that the power supply unit is being charged and the output voltage of the power supply unit detected by the voltage detection unit is maintained at a level not lower than the second voltage not lower than the first voltage for at least a predetermined length of time.

In this case, too, the apparatus may comprise a display permission unit for restarting the display on the display unit when the initialization unit performs the initialization process.

Instead of this, the apparatus may comprise a display permission unit for restarting the display on the display unit when the output voltage of the power supply unit detected by the voltage detection unit reaches a third voltage not less than the second voltage after the initialization processing by the initialization unit.

According to still another aspect of the invention, there is provided a method of controlling an electronic apparatus comprising a chargeable power supply unit and a display unit supplied with power from the power supply unit for display, wherein the display on the display unit is prohibited in the case where the output voltage of the power supply unit reaches a first voltage, the initialization process is performed in the case where the output voltage of the power supply unit reaches a second voltage lower than the first voltage, and the display on the display unit is restarted in the case where the voltage of the drive power supply unit reaches a third voltage not lower than the first voltage after reaching the second voltage.

According to yet another aspect of the invention there is provided a method of controlling an electronic apparatus comprising a chargeable power supply unit and a display unit supplied with power from the power supply unit for display, wherein the display on the display unit is prohibited in the case where the output voltage of the power supply unit decreases and reaches a first voltage, and the initialization process is performed while at the same time restarting the display on the display unit in the case where, after prohibition of the display on the display unit, the power supply unit is being charged and the output voltage of the power supply unit reaches a second voltage not lower than the first voltage.

According to a further aspect of the invention there is provided a method of controlling an electronic apparatus comprising a chargeable power supply unit and a display unit supplied with power from the power supply unit for display, wherein the display on the display unit is prohibited in the case where the output voltage of the power supply unit reaches a first voltage, and the initialization process is performed while at the same time restarting the display on the display unit in the case where, after prohibition of the display on the display unit, the power supply unit is being charged and the output voltage of the power supply unit is maintained at a level not lower than a second voltage not lower than the first voltage for at least a predetermined length of time.

According to a still further aspect of the invention, there is provided an electronic apparatus comprising a charging unit supplied with electric energy from a charger for charging a secondary battery, a voltage detection unit for detecting the terminal voltage of the secondary battery, a storage unit for storing a first data table representing the relation between the output voltage of the secondary battery and the battery charge or the battery voltage of the secondary battery in an uncharged state and a second data table representing the relation between the terminal voltage of the secondary battery and the battery charge or the battery voltage of the secondary battery in a charged state, and a control unit for estimating the battery charge or the battery voltage of the secondary battery from the terminal voltage detected by the voltage detection unit, using the first data table stored in the storage unit in an uncharged state and estimating the battery charge or the battery voltage of the secondary battery from the voltage detected by the voltage detection unit, using the second data table stored in the storage unit in a charged state.

With this electronic apparatus, the battery charge or the battery voltage can be accurately estimated in both charged and uncharged states.

In a preferable form, the electronic apparatus according to this aspect of the invention comprises a display unit, and the control unit causes the result of estimating the battery charge or the battery voltage to be displayed on the display unit.

In this case, the display unit, alternatively to or in addition to the display of the result of estimating the battery charge or the battery voltage, may display the number of days for which the electronic apparatus is still operable, determined based on the result of estimating the battery charge or the battery voltage.

In a preferable form, the secondary battery is charged periodically and intermittently by a charger. The control unit transmits to the charger a command to switch the duty factor of the charging time with respect to the charging period whenever predetermined conditions are met.

The storage unit stores a plurality of the second data tables corresponding to the duty factor, and the control unit estimates the battery charge and the battery voltage of the secondary battery using one of the data tables corresponding to the duty factor of the charging operation currently performed.

In a preferable form, the control unit transmits to the charger a command to switch to a higher duty factor upon the lapse of a predetermined length of time from the start of charging the secondary battery.

As an alternative, the control unit transmits to the charger a command to switch to a higher duty factor when the estimated value of the battery charge or the terminal voltage of the secondary battery reaches a predetermined value.

In a preferable form, the control unit transmits to the charger a command to stop the charging operation when the battery charge or the battery voltage of the secondary battery reaches a predetermined value.

In the various forms described above, the following improvements may be included. Specifically, the electronic apparatus comprises an internal resistance measuring unit for measuring the internal resistance of the secondary battery. The storage unit has stored therein a plurality of the first data tables and a plurality of the second data tables corresponding to a plurality of different internal resistances. The control unit estimates the charge of the secondary battery using the first table or the second table corresponding to the internal resistance of the secondary battery measured by the internal resistance measuring unit.

The internal resistance measuring unit calculates the internal resistance based on, for example, the open-circuit voltage of the secondary battery and the voltage with a predetermined load connected to the secondary battery.

According to a yet further aspect of the invention, there is provided a method of controlling an electronic apparatus comprising a charging unit supplied with electric energy from a charger for charging a secondary battery, a voltage detection unit for detecting the terminal voltage of the secondary battery, a storage unit and a display unit, wherein a first data table representing the relation between the output voltage of the secondary battery and the battery charge or the battery voltage of the secondary battery in an uncharged state and a second data table representing the relation between the terminal voltage of the secondary battery and the battery charge or the battery voltage of the secondary battery in a charged state are stored in the storage unit in advance, the battery charge or the battery voltage of the secondary battery is estimated from the terminal voltage detected by the voltage detection unit using the first data table stored in the storage unit in an uncharged state, the battery charge or the battery voltage of the secondary battery is estimated from the voltage detected by the voltage detection unit using the second data table stored in the storage unit in a charged state, and the result of estimation is displayed on the display unit.

BRIEF DESCRIPTION OF THE DRAWINGS

FIG. 4 is a diagram for explaining the operation of a voltage detection circuit and a MPU according to a first embodiment of the invention.

FIG. 7 is a diagram for explaining the operation of the voltage detection circuit and the MPU according to a second embodiment of the invention.

FIG. 10 is a diagram for explaining the operation of the voltage detection circuit and the MPU according to a third embodiment of the invention.

FIG. 19 is a diagram for explaining an operation according to the fourth embodiment of the invention.

BEST MODE FOR CARRYING OUT THE INVENTION

Now, preferred embodiments of the invention will be explained with reference to the drawings.

[1] First Embodiment

Figure 1:
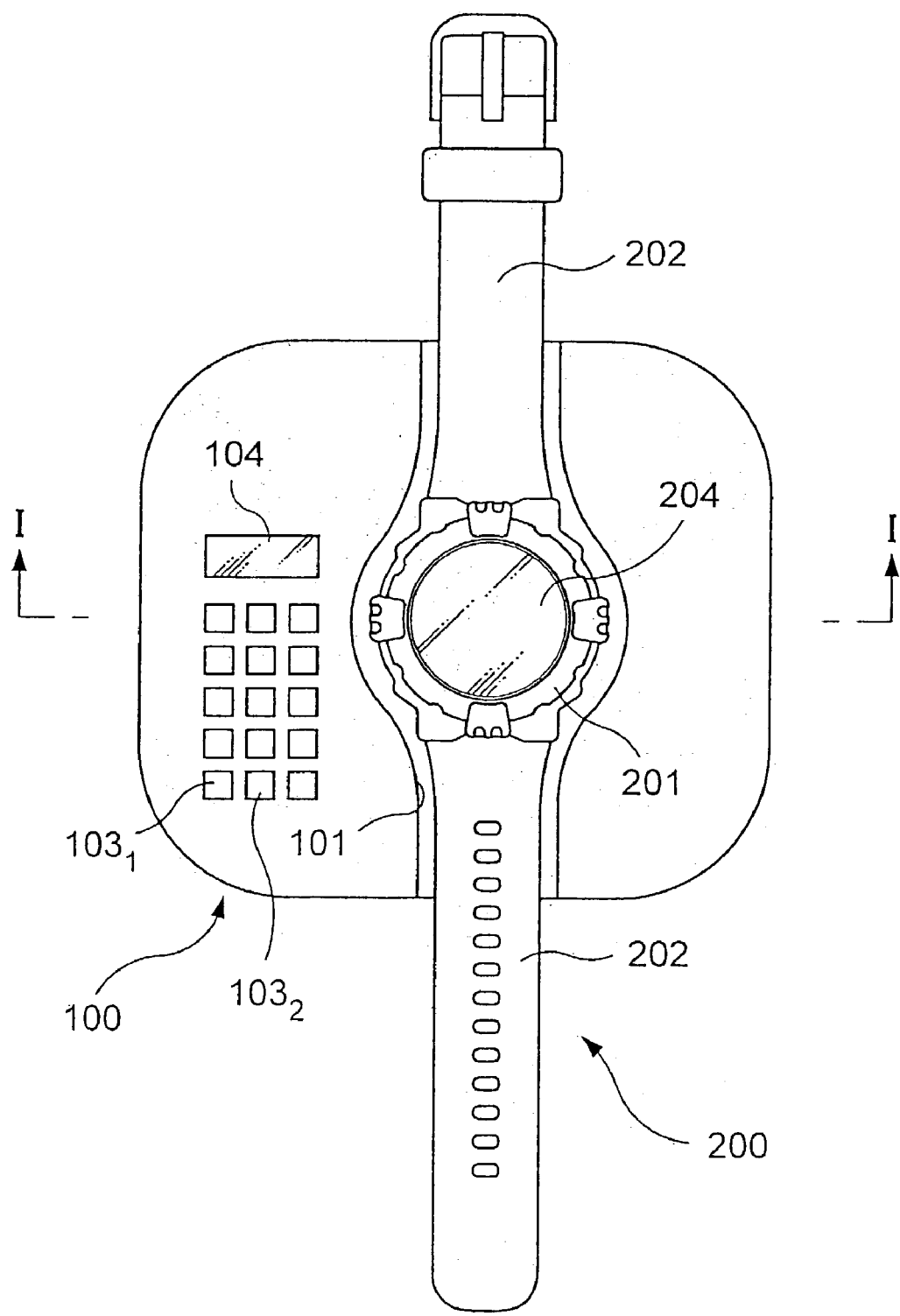
FIG. 1 is a plan view showing a configuration of a station and an electronic watch according to an embodiment of the invention.

FIG. 1 is a plan view showing a configuration of an electronic watch and a station according to a first embodiment of the invention.

In FIG. 1, an electronic watch 200, which is an electronic apparatus like a wrist watch having a secondary battery built therein as a power supply, is supplied with power from the secondary battery for performing dual function of a watch and an information processing unit. More specifically, under normal operating conditions, the electronic watch 200 is worn on the wrist of the user, and displays the date/time and the like on a display unit 204 on the one hand and processes the biological information such as the pulse rate and the heart rate detected and stored at regular time intervals by a sensor or the like not shown on the other. A station 100 is a device used for charging the secondary battery of the electronic watch 200 or transferring data to or from the electronic watch 200. The station 100 includes a depression 101 somewhat larger than the body 201 and the band 202 of the electronic watch 200. The electronic watch 200 is secured to the station 100 with the body 201 and the band 202 accommodated in the depression 101.

The station 100 includes various input units such as a charge start button $103_1$ for instructing the charge operation to be started and a transfer start button $103_2$ for instructing to start data transfer, and a display unit 104 for displaying various information.

Figure 2:
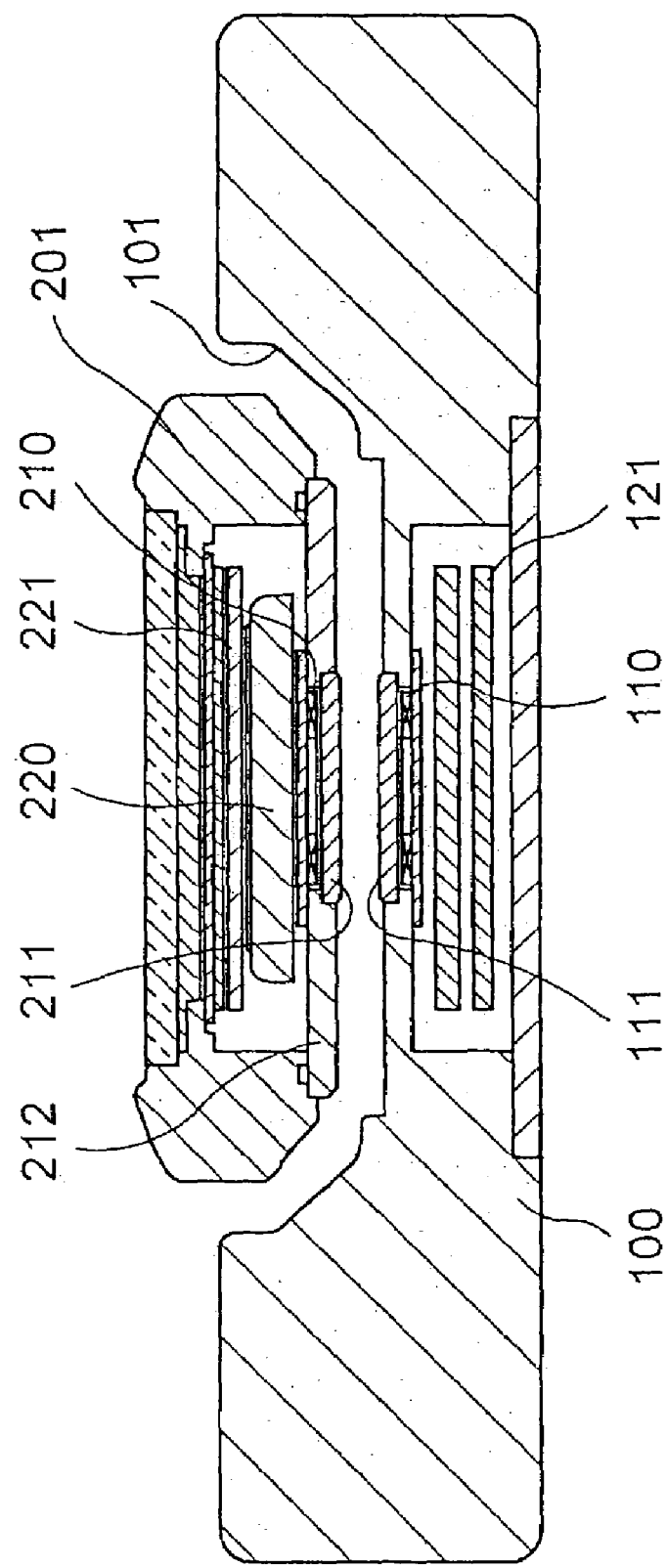
FIG. 2 is a sectional view showing a configuration of a station and an electronic watch.

FIG. 2 is a sectional view taken in line I-I in FIG. 1.

As shown in FIG. 2, the lower surface of the body 201 of the electronic watch 200 is enclosed by a back cover 212. The electronic watch 200 is securely fixed on the station 100 with the back cover 212 placed in opposed relation with the bottom of the depression 101. A circuit board 221 and a secondary battery 220 for supplying a source voltage to the circuit on the circuit board 221 are accommodated in the space inside of the back cover 212 of the body 201. The back cover 212 has an opening which is closed by a cover glass 211. A watch-side coil 210 for transferring data or charging is arranged on the inner surface of the cover glass 211.

A chamber for accommodating the circuit board 121 connected to the charge start button $103_1$, the transfer start button $103_2$, the display unit 104 and the primary power supply (not shown) is arranged in the bottom portion of the depression 101 of the station 100. The top of this chamber has an opening which is closed by a cover glass 111. A station-side coil 110 is fixed on the inside of the cover glass 111. The station-side coil 110 is arranged in opposed relation with the coil 210 in the body 201 of the electronic watch 200 through the cover glass 111 of the station 100 and the cover glass 211 of the electronic watch 200.

With the electronic watch 200 accommodated in the station 100 in this way, the station-side coil 110 and the watch-side coil 210 are physically kept out of contact with each other by the cover glasses 111, 211. Nevertheless, the station-side coil 110 and the watch-side coil 210 are electromagnetically coupled to each other in view of the fact that the coils are wound with the surfaces thereof substantially parallel to each other.

The station-side coil 110 and the watch-side coil 210 are both of hollow type having no magnetic core to avoid magnetization of the movement of the watch, to avoid a weight increase of the watch and to avoid exposure of the magnetic metal. In an application of the electronic apparatus which is not affected by these consideration, however, a coil having a magnetic core may be used. The coils of hollow type well serve the purpose, however, as long as the signal frequency applied to the coils is sufficiently high.

Figure 3:
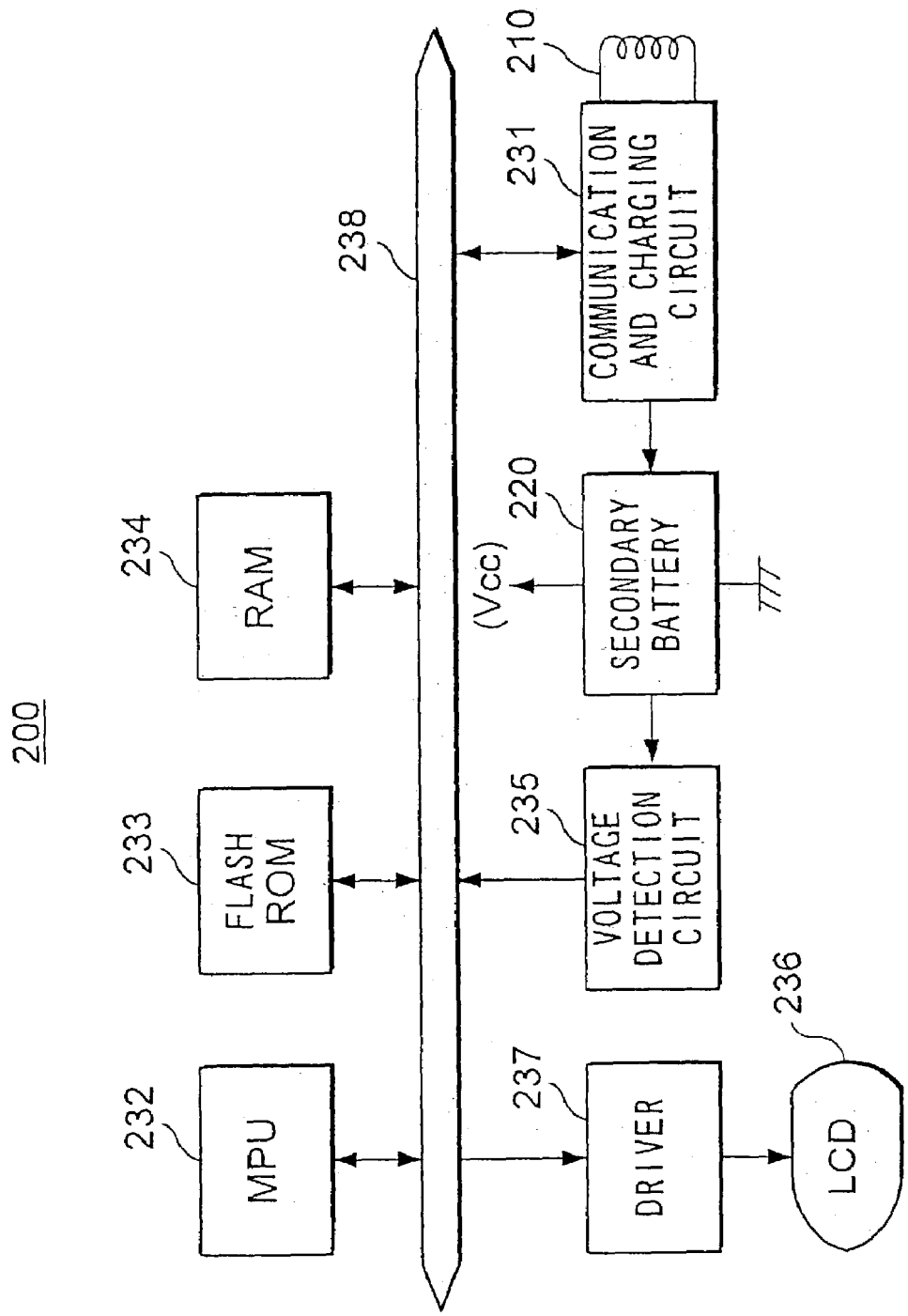
FIG. 3 is a block diagram showing an electrical configuration of an electronic watch.

FIG. 3 is a block diagram showing a configuration of the electronic watch 200.

In FIG. 3, a communication and charging circuit 231, a microprocessor unit (MPU) 232, a flash ROM 233, a RAM 234, a voltage detection circuit 235, a LCD 236 and a LCD driver 237 are mounted on the circuit board 221 (FIG. 2) of the electronic watch 200.

Further, a bus 238 for interconnecting these parts is formed on the circuit board 221.

The MPU 232 controls the whole of the electronic watch 200. The communication and charging circuit 231 is supplied with power from the station 100 through the watch-side coil 210 and supplies a charge current to the secondary battery 220. The communication and charging circuit 231 also transmits and receives data to and from the station 100 through the watch-side coil 210.

The secondary battery 220 is charged by the current supplied from the communication charging unit 231. The output voltage of the secondary battery 220 is supplied as a drive source voltage to each part of the electronic watch 200.

The flash ROM 233 is a nonvolatile memory for storing a control program and data.

The RAM 234 is used for storing data temporarily or as a working area of the MPU 232.

The LCD driver 237 displays various data on the LCD 236 under the control of the MPU 232.

The voltage detection circuit 235 executes A/D conversion of the output voltage of the secondary battery 220 and outputs the resulting detection level data. The detection level data output from the voltage detection circuit 235 are adapted to assume 16 values of "0" to "15" in accordance with the output voltage of the secondary voltage 220. FIG. 4 shows the minimum voltage and the maximum voltage for defining the range of the output voltage of the secondary battery 220 in which each of the detection level data "0" to "15" is output. The detection level data "0", for example, is output from the voltage detection circuit 220 when the output voltage of the secondary battery 220 is in the range of 1 V to 1.2 V. This is also the case with the other detection level data "1" to "15". FIG. 4 also contains the description of the operation performed by the MPU 232 when the detection level data "9", "10" and "11" are output. As shown in FIG. 4, the MPU 232 according to this embodiment prohibits the display of the liquid crystal display unit 236 when the output voltage of the secondary battery 220 drops to such an extent that the detection level data comes to assume "10".

Regardless of whether the voltage is rising or falling, once the detection level reaches "9", the MPU 232 executes the initialization process. In this initialization process, the system information such as the operating system and the application program or the watch information for watch display are transferred to the RAM 234 from the flash ROM 233.

Further, in the case where the output voltage of the secondary battery rises to such an extent that the detection level data reaches "11", the MPU 232 permits the liquid crystal display unit 236 to display information.

Figure 5:
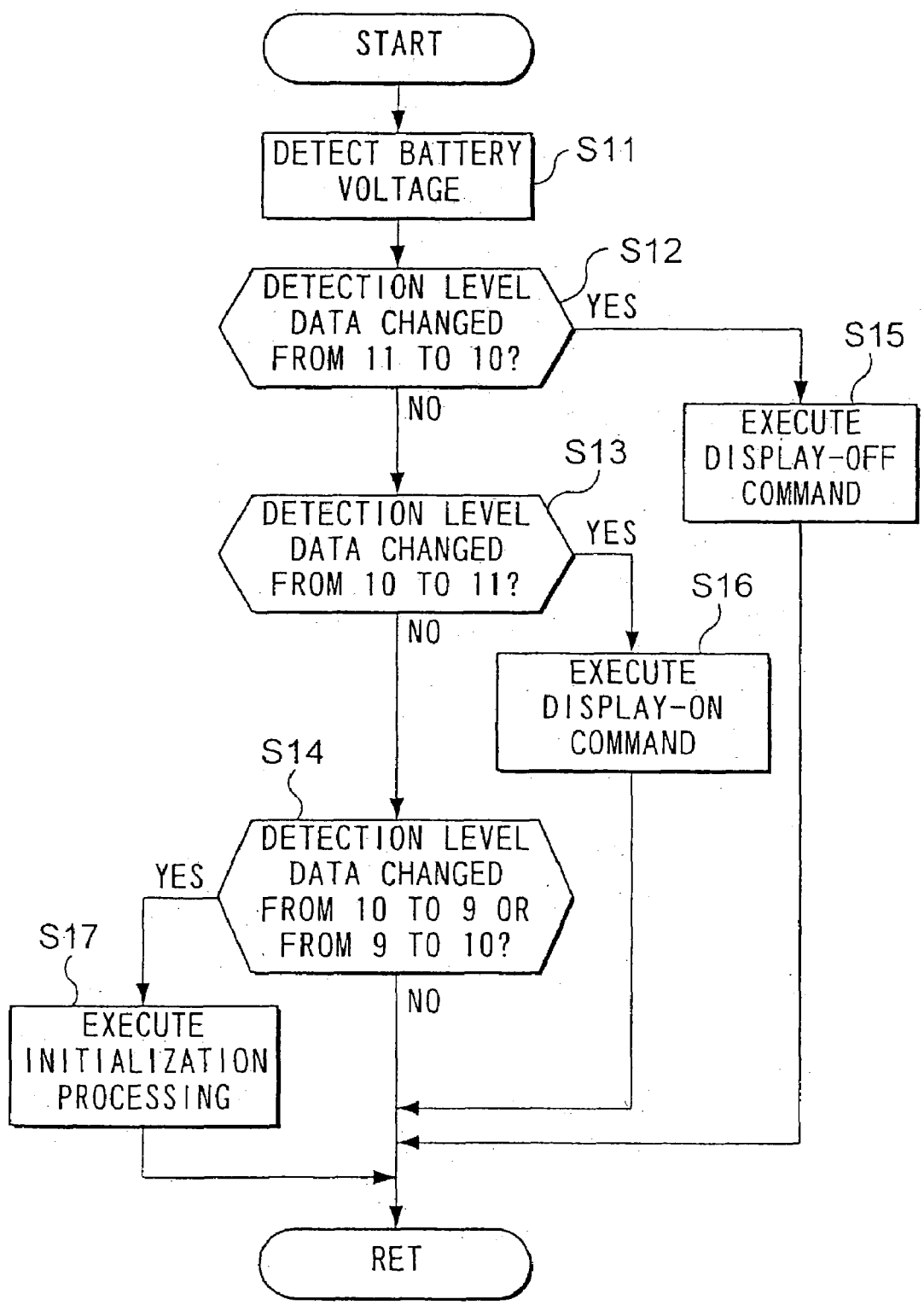
FIG. 5 is a flowchart showing the operation according to the first embodiment of the invention.

For performing the control operation described above, the MPU 232 repeatedly executes the routine of which the flow is shown in FIG. 5. More specifically, according to this embodiment, the detection level data are output at regular time intervals by the voltage detection circuit 235. Each time the level detection data is output, the MPU 232 executes the routine of FIG. 5. The operation according to this embodiment will be explained below with reference to FIG. 5.

First, the MPU 232 gets the detection level data output from the voltage detection circuit 235 (step S11). Then, the MPU 232 determines whether the detection level data has changed from "11" to "10" based on the detection level data gotten presently and previously (step S12). In the case where this determination is NO, the MPU 232 determines whether the detection level data has changed from "10" to "11" or not (step S13). In the case where the determination in step S13 is NO, the MPU 232 determines whether the detection level data has changed from "10" to "9" or from "9" to "10" or not (step S14). In the case where the determination in step S14 is NO, the MPU 232 terminates the routine of FIG. 5.

As long as the output voltage of the secondary battery 220 is sufficiently high and the detection level data is not lower than "12", the MPU 232 repeats the steps S11, S12, S13 and S14 described above.

Figure 6:
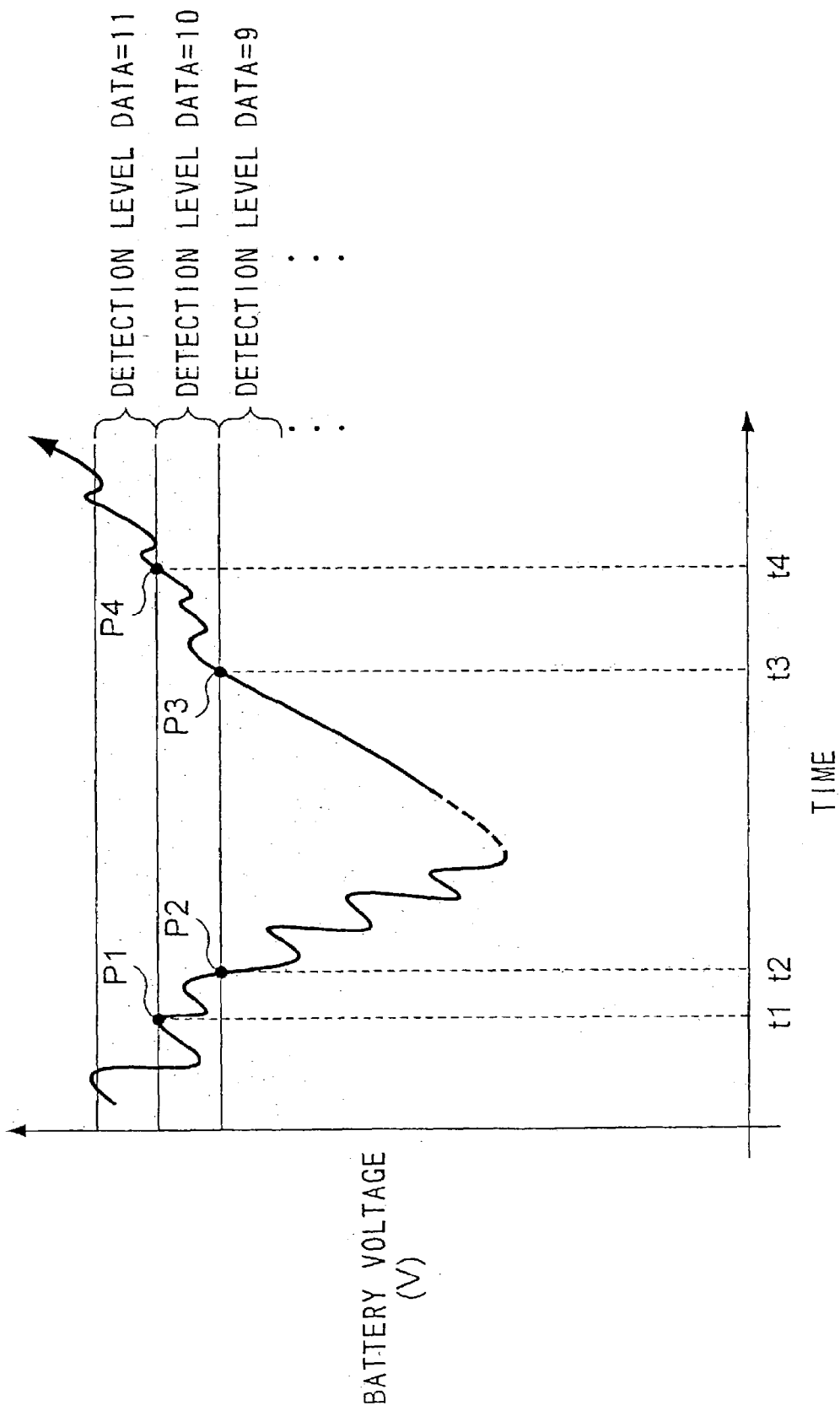
FIG. 6 is a waveform diagram for explaining the operation according to the first embodiment of the invention.

In the case where the electronic watch 200 continuously operates, the current flows out of the secondary battery 220 due to the operation, and therefore the output voltage of the secondary battery 220 gradually drops. On the other hand, the secondary battery 220 may be naturally restored or charged. In such a case, the output voltage of the secondary battery 220 rises. Also, when the electronic watch 200 is in operation, the operation current causes the voltage drop across the internal resistance of the secondary battery 220. As a result, the output voltage of the secondary battery 220 pulsates in short cycles. FIG. 6 is a waveform diagram showing the manner in which the output voltage of the secondary battery 200 changes with time as described above. Returning to FIG. 5, an explanation will be given of the operation of the MPU 232 performed when the output voltage of the secondary battery 220 changes with time as shown in FIG. 6.

First, in FIG. 6, assume that the detection level data "11" is output from the voltage detection circuit 235 immediately before time point t1. Also, assume that as shown in FIG. 6, the output voltage of the secondary battery 220 reaches P1 and the detection level data "10" is output from the voltage detection circuit 235 at time point t1 (FIG. 4). Again assume that the routine shown in FIG. 5 begins to be executed by the MPU 232 immediately after this time point. In view of the fact that the detection level data has changed from "11" to "10", the determination in step S12 to which the process has proceeded from step S11 is YES, so that the process of the MPU 232 proceeds to step S15. In step S15, the MPU 232 controls the driver 237 to prohibit the display on the liquid crystal display unit 236. The MPU 232 thus terminates the routine of FIG. 5.

After that, assume that the voltage of the secondary battery 220 further drops, and as shown in FIG. 6, for example, the output voltage of the secondary battery 220 becomes P2 and the detection level data "9" is output at time point t2. In the case where the routine of FIG. 5 is started immediately after this time point, the determination is NO in both steps S12 and S13. In view of the fact that the detection level data has changed from "10" to "9", the determination in step S14 is YES, so that the process of the MPU 232 proceeds to step S17. In step S17, the MPU 232 performs the initialization process for transferring the system information or the watch information for watch display from the flash ROM 233 to the RAM 234. The system information are defined as the operating system, the application system and the like.

After that, assume that the natural restoration or charging of the secondary battery 220 increases the output voltage of the secondary battery 220 and as shown in FIG. 6, for example, reaches P3 and the detection level data output from the voltage detection circuit 235 has changed from "9" to "10" at time point t3.

If the routine of FIG. 5 is started immediately after this time point, the determination is NO in both steps S12 and S13. In view of the fact that the detection level data has changed from "9" to "10", the determination in step S14 is YES, and the process of the MPU proceeds to step S17. The MPU 23 thus performs the initialization process as already described.

Further, assume that the output voltage of the secondary battery 220 rises (is restored), and as shown in FIG. 6, reaches P4 and the detection level data has changed from "10" to "11" at time point t4.

If the routine of FIG. 5 is started immediately after this time point, the determination in step S12 becomes NO. In view of the fact that the detection level data has changed from "10" to "11", the determination in step S13 is YES so that the process of the MPU 232 proceeds to step S16. In step S16, the MPU 232 controls the driver 237 to restart the display on the liquid crystal display unit 237 (step S16).

The display may be restarted when the detection level data changes from "9" to "10" instead of when the detection level data changes from "10" to "11" as described above.

It will be understood from the foregoing description that according to this embodiment, the battery voltage which has dropped to prohibit the display (corresponding to the detection level data "10") is differentiated from the battery voltage for initialization processing (corresponding to the detection level data "9"). For this reason, the initialization processing is always carried out when the display is off.

Therefore, the initialization processing is never carried out without the knowledge of the user unlike in the prior art, thereby improving the convenience of the user.

Second Embodiment

Now, a second embodiment of the invention will be explained.

The configuration of the station and the electronic watch according to this embodiment are similar to that of the first embodiment, and therefore only the operation will be explained.

FIG. 7, like FIG. 4, shows the minimum voltage and the maximum voltage for defining the range of the output of the secondary battery 220 in which each of the detection level data "0" to "15" is output from the voltage detection circuit 235. FIG. 7 also contains the description of the operation of the MPU 232 performed when the detection level data "9" and "10" are output.

As shown in FIG. 7, the MPU 232 prohibits the display on the liquid crystal display unit 236 in the case where the output voltage of the secondary battery 220 drops and the detection level data reaches "9". In the case where the output voltage increases by charging and the detection level data reaches "10", on the other hand, the MPU 232 permits the initialization processing and the display on the liquid crystal display unit 236 as explained above with reference to the first embodiment.

Figure 8:
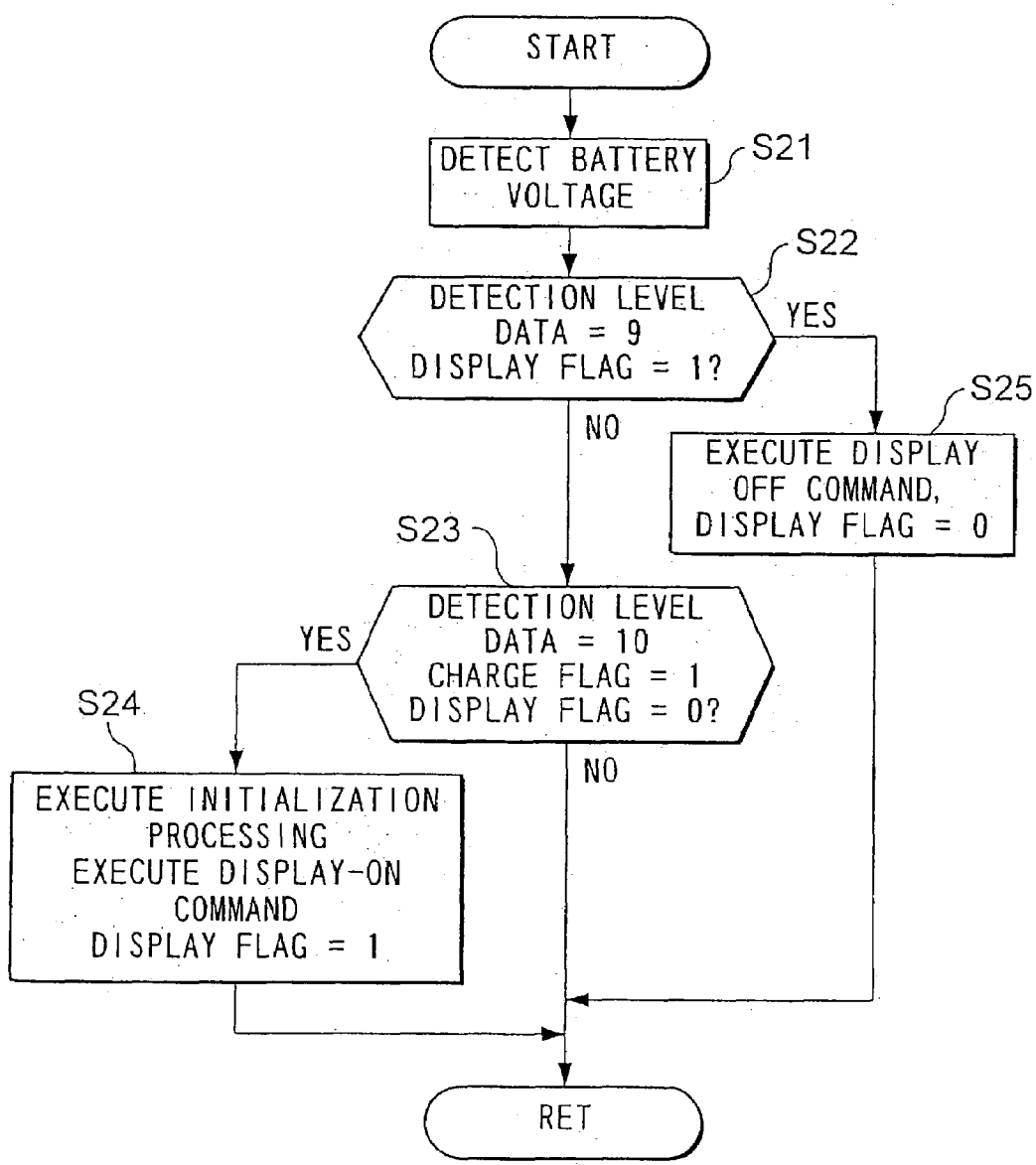
FIG. 8 is a flowchart showing the operation according to the second embodiment of the invention.

For performing the control operation described above, the MPU 232 repeatedly executes the routine with the flow thereof shown in FIG. 8 at predetermined intervals of time. This routine includes the determination on the charge flag and the display flag. The charge flag is set to "1" by the communication and charging circuit 231 during the time when the secondary battery 220 is being charged. The display flag, on the other hand, is set to "1" by the MPU 232 during the time when the liquid crystal display unit 236 is in display operation.

When the MPU 232 starts the routine of FIG. 8, it first gets the detection level data output from the voltage detection circuit 235 (step S21). Then, the MPU 232 determines whether the detection level data currently gotten is "9" and the display flag is "1" or not (step S22). In the case where this determination is NO, the MPU 232 determines whether the detection level data is "10", the charge flag "1" and the display flag is "0" or not (step S23). In the case where this determination is NO, the MPU 232 terminates the routine of FIG. 8.

As long as the output voltage of the secondary battery 220 is sufficiently high and the detection level data is not less than "11", the MPU 232 repeats the steps S21, S22 and S23 as described above.

Figure 9:
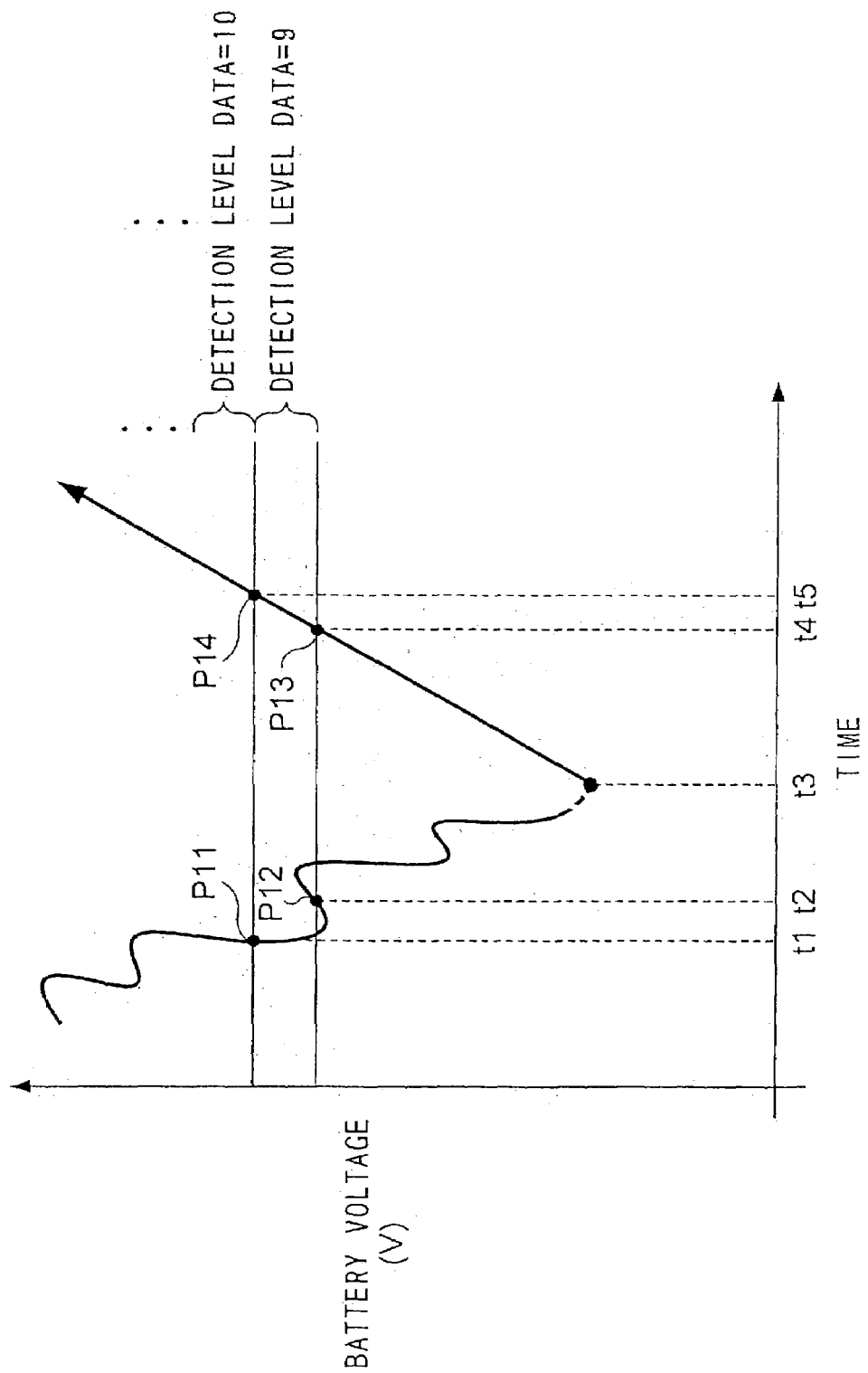
FIG. 9 is a waveform diagram for explaining the operation according to the second embodiment of the invention.

Now, assume that the output voltage of the secondary battery 220 has changed with time as shown in FIG. 9. The MPU 232 operates in the following manner.

First, as shown in FIG. 9, it is assumed that the output voltage of the secondary battery 220 becomes P11 and the detection level data changes from "10" to "9" at time point t1. Also, it is assumed that immediately after this time point, the routine of FIG. 8 is executed, and when the process proceeds to step S22 through step S21, the display flag is "1". In view of the fact that the detection level data is "9", the determination in step S22 is YES, so that the process of the MPU 232 proceeds to step S25. In step S25, the MPU 232 executes a display-off command to control the driver 237 and thus prohibits the display on the liquid crystal display unit 236. Thus, the MPU 232 sets the display flag to "0" (step S25).

After that, it is assumed that the voltage of the secondary battery 220 changes and as shown in FIG. 9, the detection level data falls to "8", after which the output voltage of the secondary battery 220 becomes P12 and the detection level data "9" at time point t2.

In the routine of FIG. 8 executed immediately after this time point, the display flag is "0" in the determination of step S22, and therefore the process proceeds to step S23, so that no effective processing is carried out.

After that, the charge operation is started by the station 100 through the communication and charging circuit 231 at time point t3.

It is assumed that, with further lapse of time, as shown in, FIG. 9, the output voltage of the secondary battery 220 becomes P13 and the detection level data changes from "8" to "9" at time point t4. In the routine of FIG. 8 executed immediately after this time point, the determination in step S22 becomes NO in view of the fact that the display flag is "0" on the one hand and the determination in step S23 is NO in view of the fact that the detection level data is "9" on the other hand. Therefore, no processing is carried out.

It is assumed that the output voltage of the secondary battery 220 becomes P14 and the detection level data becomes "10" at time point t5. Upon execution of the routine of FIG. 8 immediately after this time point, the fact that the detection level data is "10", the charge flag is "1" and the display flag is "0" leads to the determination YES in step S23, so that the process of the MPU 232 proceeds to step S24. In step S24, the MPU 232 executes the initialization processing similar to that described above with reference to the first embodiment.

The MPU 232 executes a display-on command to set the liquid crystal display unit 236 in display mode and sets the display flag to "1".

As described above, according to this embodiment, after the display is prohibited due to the drop of the output voltage of the secondary battery 220, the initialization processing is performed and the display is restarted only in the case where the output voltage of the secondary battery 220 reaches a predetermined voltage higher than the voltage at which the display is prohibited and the charging operation is being performed. As a result, the initialization processing is not performed without the knowledge of the user for an improved convenience of the user.

[3] Third Embodiment

A third embodiment of the invention will be explained.

The configuration of the station and the electronic watch according to this embodiment is similar to that of the first embodiment and therefore only the operation will be explained.

FIG. 10, like FIG. 4, shows the minimum voltage and the maximum voltage for defining the range of the output voltage of the secondary battery 220 in which each of the detection level data "0" to "15" is output from the voltage detection circuit 235. Also, FIG. 10 contains the description of the operation performed by the MPU 232 when the detection level data "9" is output.

As shown in FIG. 10, the MPU 232 prohibits the display on the liquid crystal display unit 236 when the output voltage of the secondary battery 220 drops to such an extent that the detection level data reaches "9". After that, when the output voltage of the secondary battery 220 is increased by charging and the detection level data "9" is reached and maintained for a predetermined length of time, the MPU 232 restarts the display and performs the initialization processing. The initialization processing is similar to that explained with reference to the first embodiment.

For performing the control operation described above, the MPU 232 executes the routine of FIG. 11 repeatedly at regular time intervals. This routine, like in the second embodiment, includes the determination on the charge flag and the display flag. These flags have been explained with reference to the second embodiment.

Figure 11:
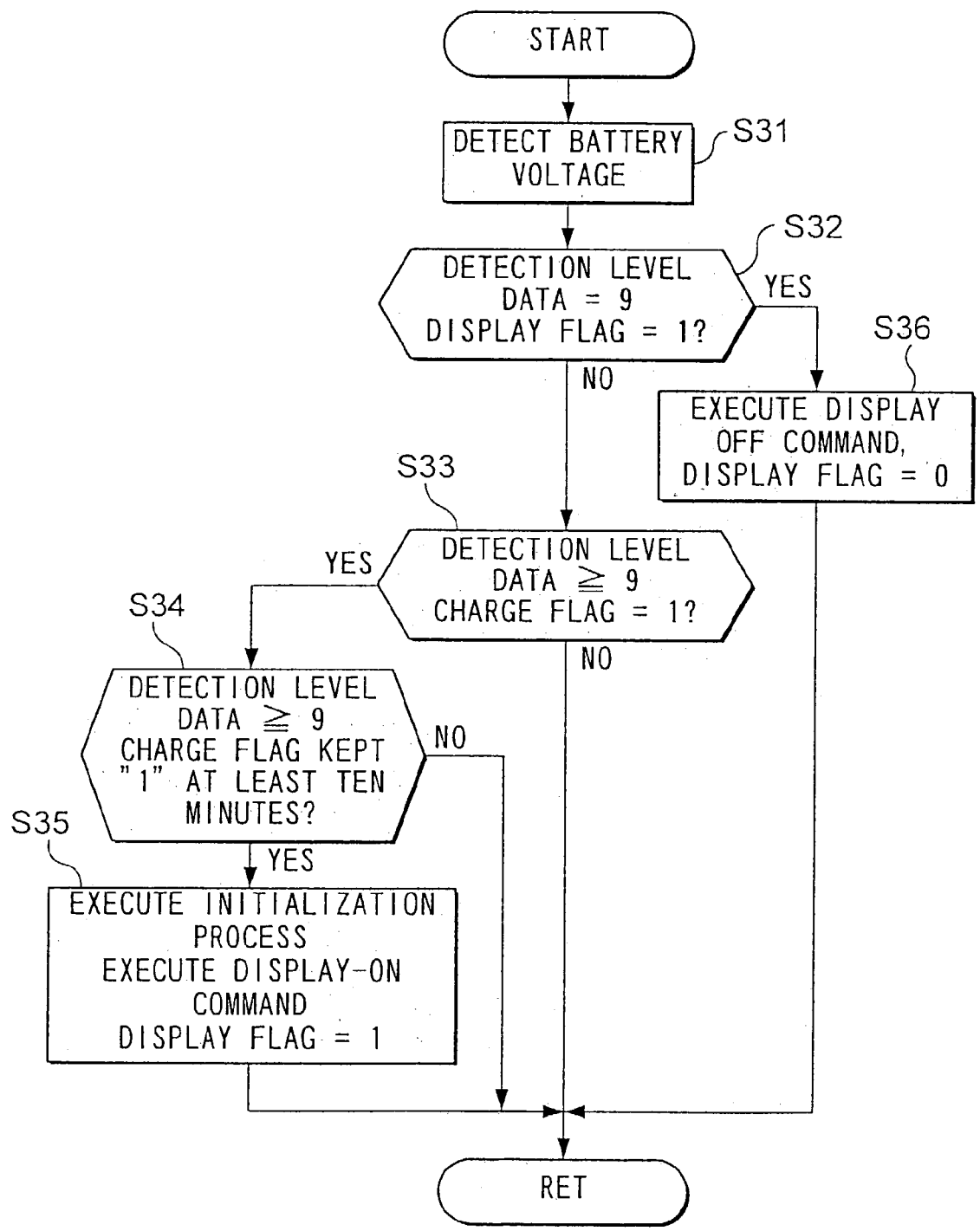
FIG. 11 is a flowchart showing the operation according to the third embodiment of the invention.

The MPU 232 starts the routine of FIG. 11 with getting the detection level data output from the voltage detection circuit 235 (step S31). Then, the MPU 232 determines whether the detection level data currently gotten is "9" and the display flag is "1" or not (step S32). In the case where this determination is NO, the MPU 232 determines whether the detection level data is "9" and the charge flag is "1" or not (step S33). In the case where this determination is NO, the MPU 232 terminates the routine of FIG. 11.

It is assumed that the output voltage of the secondary battery 220 is sufficiently high, the detection level data is not lower than "10", and that the charge operation is not going on. During such a period, the MPU 232 repeats the process of steps S31, S32 and S33 described above.

Figure 12:
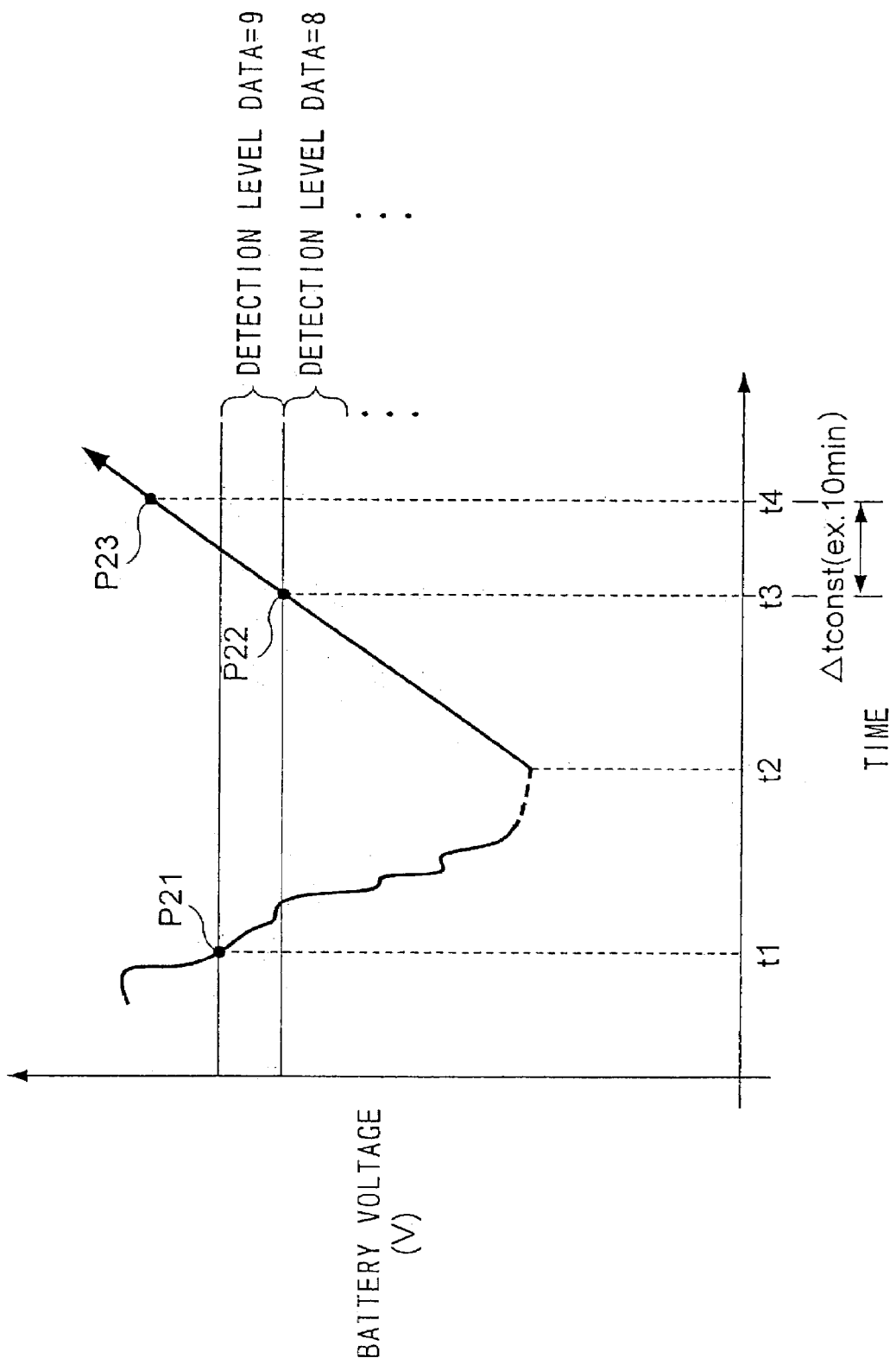
FIG. 12 is a waveform diagram for explaining the operation according to the third embodiment of the invention.

It is assumed that the output voltage of the secondary battery 220 has changed with time as shown in FIG. 12. In this case, the MPU operates in the following manner. First, as shown in FIG. 12, it is assumed that the output voltage of the secondary battery 220 becomes P21 and the detection level data changes from "10" to "9" at time point t1. Immediately after this time point, assume that the routine of FIG. 11 is executed, and when the process proceeds to step S32 through step S31, the display flag is "1". Since the detection level data is "9", the determination in step S32 is YES, and the process of the MPU 232 proceeds to step S36. In step S36, the MPU 232 executes a display-off command thereby to control the driver 237 and prohibits the display on the liquid crystal display unit 236. The MPU 232 sets the display flag to "0" (step S36) and terminates the routine of FIG. 11.

After that, it is assumed that the voltage of the secondary battery 220 undergoes changes as shown in FIG. 12, the detection level data falls to "8", and the secondary battery 220 begins to be charged at time point t2. Upon execution of the routine 11 immediately after start of the charge operation, the process proceeds to step S33 since the display flag is "0" in step S32. In step S33, though the charge flag is "1", the determination is NO since the detection level data is not "9". Thus, the routine of FIG. 11 is terminated.

After that, as long as the detection level data fails to be "9", steps S31, S32 and S33 in the routine of FIG. 11 are repeated.

Assume that the output voltage of the secondary battery 220 has increased due to charging, and the detection level data has come to be "9". Upon execution of the routine of FIG. 11, the determination is YES in step S33 to which the process has proceeded through steps S31 and S32, in view of the fact that the detection level data is "9" and the charge flag is "1". Thus, the process proceeds to step S34.

In step 534, the MPU 232 determines whether a detection level of not less than "9" and a charge flag of "1" are maintained for a period not less than a predetermined time, Δtconst, (i.e. ten minutes in the present example). In the case where this determination is NO, the MPU 232 terminates the routine of FIG. 11. After that, process steps S31, S32, S33 and S34 are repeated until the detection level is maintained at not less than "9" and the charge flag is kept at "1" for the duration of period Δtconst.

As shown in FIG. 12, once the conditions of step S34 is met at time point t4, the process proceeds to step S35. In the case shown in FIG. 12, the output voltage of the secondary battery 220 is P23 and the detection level data is "10" at time point t4. However, this is only an example, and if the detection level data is never decreased below "9" before time point t4 after the determination in step S33 turns to YES, the conditions of step S34 are met.

When the process proceeds to step S35, the MPU 232 executes the initialization process, sets the display flag to "1", and executes a display-on command to restart the display on the liquid crystal display unit 236. Then, the routine of FIG. 11 is restarted.

As described above, according to this embodiment, after the display is prohibited due to the drop of the battery voltage, the initialization process is carried out and the display is resumed only in the case where the battery voltage is maintained at not lower than a predetermined level and the charging operation continues to be carried out for longer than a predetermined length of time. As a result, the case is avoided in which the initialization processing is carried out without the knowledge of the user for an improved convenience of the user.

Also, in view of the fact that the initialization processing is carried out upon the lapse of a predetermined time length following the time when a predetermined voltage is reached by charging, the otherwise undesirable case is prevented in which the source voltage is decreased under the effect of power consumption for the initialization processing and the electronic apparatus becomes inoperative at the time of initialization.

[4] Modifications of First to Third Embodiments

In the first and second embodiments, as in the third embodiment, the initialization processing may be carried out when the predetermined conditions have been continuously met for not less than a predetermined time Δtconst. Specifically, according to the first embodiment, the initialization processing is carried out only when the conditions of step S14 in FIG. 5 are met for not less than a predetermined time Δtconst, while according to the second embodiment, the initialization processing is carried out and the display restarted only when the conditions of step S23 in FIG. 8 are met for longer than a predetermined time length Δtconst.

According to the third embodiment, on the other hand, the threshold value of the output voltage of the secondary battery 220 used for determining the switching between display prohibit/display permit and the threshold value of the output voltage of the secondary battery 220 used for determination as to whether the initialization should be carried out or not are identical to each other. The two threshold values, however, may be differentiated from each other. For example, the second or third embodiment can be modified such that after the output voltage of the secondary battery reaches a threshold and the initialization processing is carried out, the display is permitted when the output voltage of the secondary battery reaches another threshold not less than the former threshold.

Further, in the aforementioned embodiments, the station 100 was explained as a charging device and the electronic watch 200 as a charged device.

However, the present invention is applicable to all the electronic apparatuses having a heavy-load drive device comparatively large in power consumption such as a flash memory. Specifically, the invention is applicable to charged devices equipped with a secondary battery 220 such as a cordless telephone, a portable telephone, a personal handy phone, a mobile personal computer or a PDA (personal digital assistants, i.e. personal information terminals) having a driven device such as a flash memory, EL (electroluminescence) display, a vibrating motor, a buzzer or a LED large in power consumption, and charging devices therefor.

[5] Fourth Embodiment

Some electronic watches have the function of indicating the battery charge or the battery voltage of the secondary battery 220 built therein. In this type of electronic watch, a table showing the correspondence between the terminal voltage and the battery charge or the battery voltage of the secondary battery 220 prepared based on the assumed normal operating conditions is used to estimate and indicate the battery charge or the battery voltage from the measurement of the terminal voltage. In the case where this type of electronic watch is charged by the station shown in the first embodiment, the battery charge or the battery voltage of the secondary battery 220 being charged is displayed on the display unit of the electronic watch. The user checks whether the secondary battery 220 has been charged to the desired battery charge level or the desired battery voltage from the particular display, and thus can terminate the charge operation at an appropriate time.

During the charge operation, however, the terminal voltage of the secondary battery 220 is increased by an amount equivalent to the voltage drop across the internal resistance of the secondary battery 220 caused by the charge current. Therefore, the battery charge or the battery voltage estimated from the correspondence table based on the terminal voltage is inaccurate.

As a result, the user who determined that the battery charge or the battery voltage is sufficient based on the display on the electronic watch and removed the electronic watch from the station may have to take the trouble to charge the apparatus again within a comparatively short time against his expectation.

It is sufficient, however, to charge the secondary battery 220 to the desired charge level. A longer charging time unnecessarily consumes power and is uneconomical. Further, a charge operation performed beyond the rated charge capacity would cause the leakage of the electrolyte of the secondary battery 220 while at the same time often deteriorating the secondary battery 220. When charging the secondary battery, therefore, the charge operation is desirably controlled in accordance with the charge capacity of the secondary battery. Such a charge control operation has conventionally been impossible, however, in view of the fact that an accurate estimated value of the battery voltage of the secondary battery 220 cannot be obtained during the charge operation as described above.

The primary object of this embodiment is to solve the aforementioned problem and perform the charge control operation by estimating the stored charge of the secondary battery 220 with a simple configuration.

First, according to this embodiment, in order to accurately estimate the battery charge or the battery voltage during the charge operation, a table showing the correspondence between the terminal voltage and the battery charge or the battery voltage of the secondary battery 220 is prepared in advance assuming that the charge operation is being performed, in addition to the correspondence table prepared on the assumption that the battery is not being charged or in normal operation. With the electronic watch not being charged or in normal operation, the correspondence table prepared in the aforementioned way is used to estimate the battery charge or the battery voltage from the actually measured terminal voltage at the time. During the charge operation, on the other hand, the correspondence table prepared on the assumption that the charge operation is going on is used to estimate the battery charge and the battery voltage from the actually measured terminal voltage at the time.

Further, according to this embodiment, in order to assure accurate estimation of the battery charge or the battery voltage during the charge operation, the secondary battery 220 is charged by use of two charging methods together. The principle of these methods will be explained below.

Figure 13:
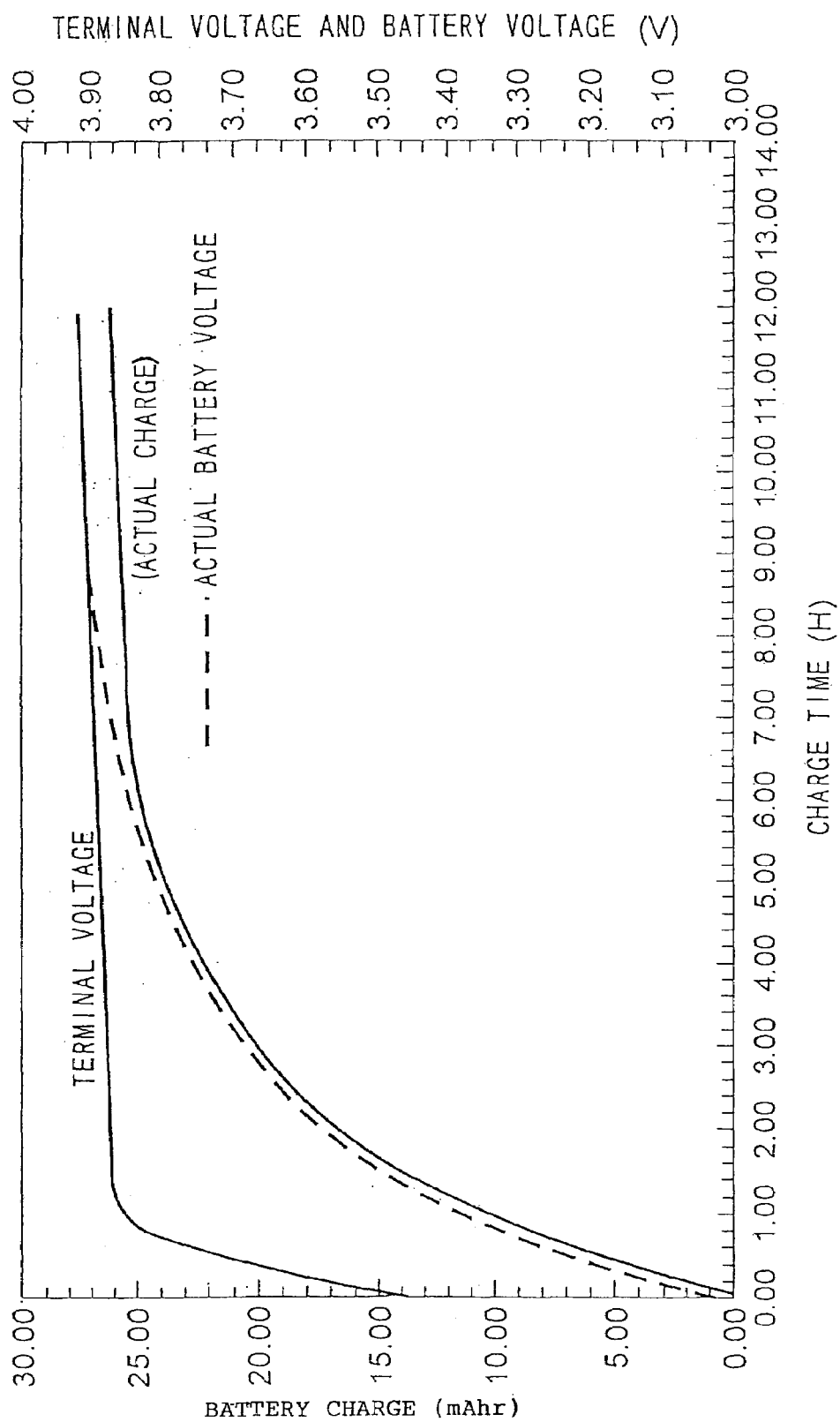
FIG. 13 is a diagram for explaining the full-duty charge operation performed according to a fourth embodiment of the invention.

FIG. 13 shows the change with time of the terminal voltage (V), the battery voltage (V) and the battery charge, (mAhr) when the secondary battery 220 is charged by being supplied with the full-duty charge pulse, i.e. a current pulse with almost 100% duty factor. In FIG. 13, the horizontal axis represents the time, and the vertical axis represents the terminal voltage and the battery voltage on the right-side scale and the charge on the left-side scale.

During the charge operation, the charge current flows in the internal resistance of the secondary battery, and therefore the terminal voltage of the secondary battery 220 increases by an amount equivalent to the voltage drop across the internal resistance as compared with the actual battery voltage. As shown in FIG. 13, in the case of the charge operation using full-duty charge pulses, the terminal voltage sharply increases from the initial value of 3.00 V and comes to assume a substantially constant value within about one hour from the start of the charge operation. On the other hand, the actual battery voltage rises along a gentle curve, and the charge of the secondary battery also rises along a gentle curve as if to follow the actual battery voltage. In the initial stage of charging, the terminal voltage is considerably different from the actual battery voltage, but becomes substantially equal to the actual battery voltage within about 12 hours from starting the charge operation.

Figure 14:
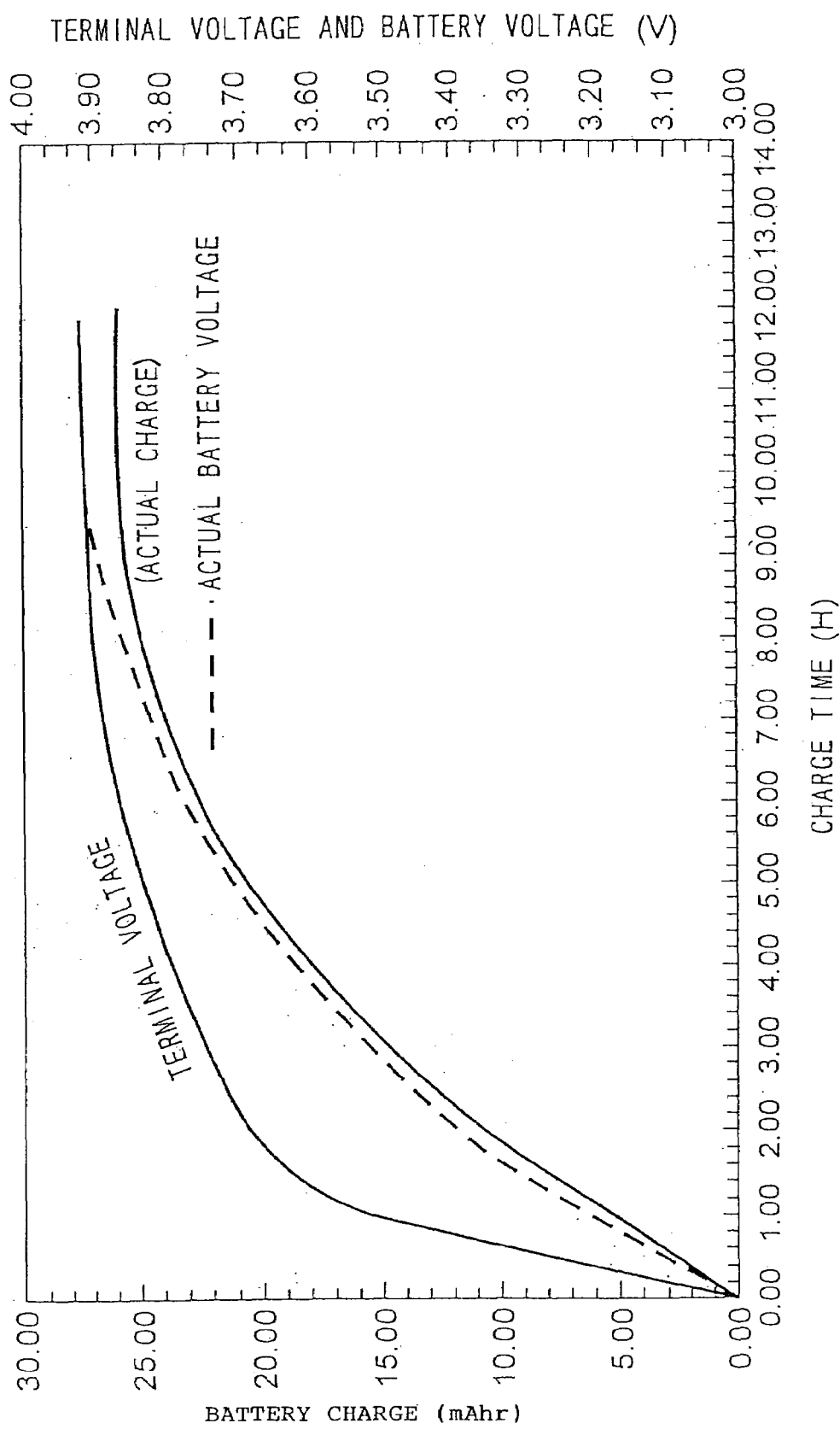
FIG. 14 is a diagram for explaining the half-duty charge operation performed according to the fourth embodiment of the invention.

FIG. 14 shows the change with time of the terminal voltage (V), the battery voltage (V) and the battery charge (mAhr) in the case where the secondary battery 220 is charged by the half-duty charge pulse, i.e. a current pulse having a duty factor of 50%.

As shown in FIG. 14, in the case where the charge operation is performed using the half-duty charge pulse, as compared with the charge operation using the full-duty charge pulse, the terminal voltage undergoes a gentle change with time and becomes substantially constant within about four hours of charge start. The actual battery voltage rises gradually along a gentle curve in the same way as in the charge operation using the full-duty charge pulse. The charge of the secondary battery 220 also rises along a gentle curve in such a manner as if to follow the actual battery voltage.

As described above, in the charge operation using the half-duty charge pulse, the difference between the terminal voltage and the actual battery voltage is small in the initial stage of charging, as compared with the charge operation using the full-duty charge pulse. Therefore, the actual battery voltage and charge can be easily estimated from the terminal voltage. The use of the half-duty charge pulse, however, lengthens the time required for the secondary battery 220 to be charged up sufficiently, as compared with when the full-duty charge pulse is used.

In view of this, according to this embodiment, during the first half period of the charge operation before the lapse of about four hours from the charge start, the half-duty charge pulse is used, while the charge operation is carried out by use of the full-duty charge pulse during the last half charge period of about 12 hours following the lapse of about four hours from the charging start.

Now, the configuration of the station 100 and the electronic watch 200 according to this embodiment will be explained.

Figure 15:
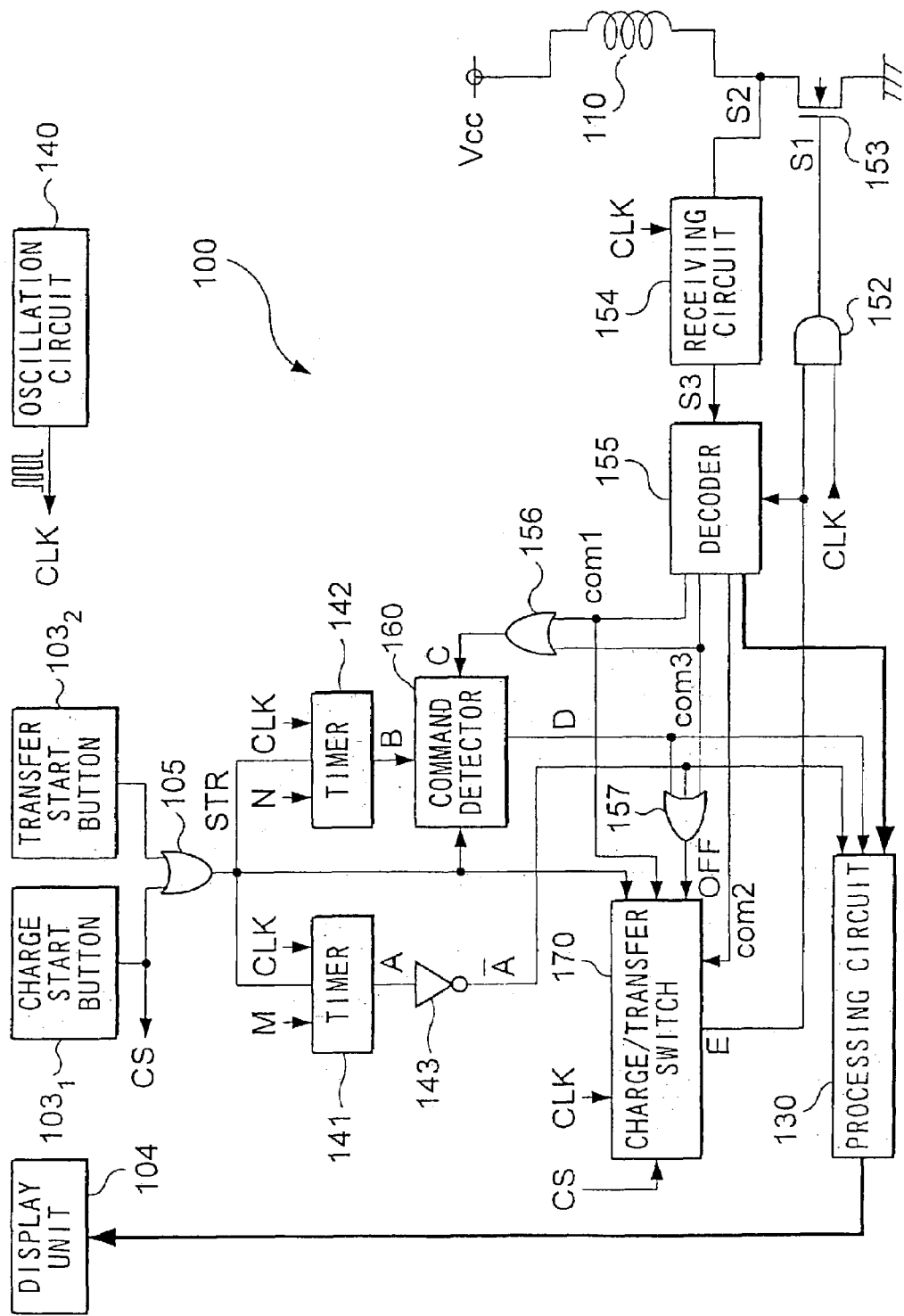
FIG. 15 is a block diagram showing a configuration of a station according to the fourth embodiment of the invention.

FIG. 15 is a block diagram showing the configuration of the station 100 according to this embodiment. In FIG. 15, an oscillation circuit 140 outputs a clock signal CLK for assuring synchronized operation of various parts. A station-side coil 110 plays the role as an antenna for receiving the signal sent in from the electronic watch 100. The station-side coil 110 also has the function of generating a burst-like AC magnetic field intermittently when charging the secondary battery 220 in the electronic watch 200. This burst-like AC magnetic field constitutes a full-duty charge pulse or a half-duty pulse in the electronic watch 200 as described above.

One of the terminals of the station-side coil 110 is fixed to a source voltage Vcc, and the other terminal is connected to the drain terminal of a transistor 153. The source terminal of transistor 153 is grounded, and the gate thereof is connected to the output of an AND gate 152. One of the input terminals of AND gate 152 is supplied with clock signal CLK, and another of its input terminals is supplied with signal E from a charge/transfer switch 170. The charge/transfer switch 170 controls the switching of the level of signal E. The level switching of signal E will be explained in detail later.

The gate of the transistor 153 is supplied with the clock signal CLK through the AND gate 152 during the period when the signal E is at H level, thereby switching ON and OFF a path between its drain terminal and source terminal. As a result as shown in FIG. 15, the station-side coil 110 is supplied with a pulse signal obtained by switching ON and OFF transistor 153 and thereby controlling a current path for source voltage Vcc through coil 110 in accordance with the clock signal CLK. As long as signal E remains at H level, therefore, the station-side coil 110 generates a burst-like AC magnetic field.

Figure 18:
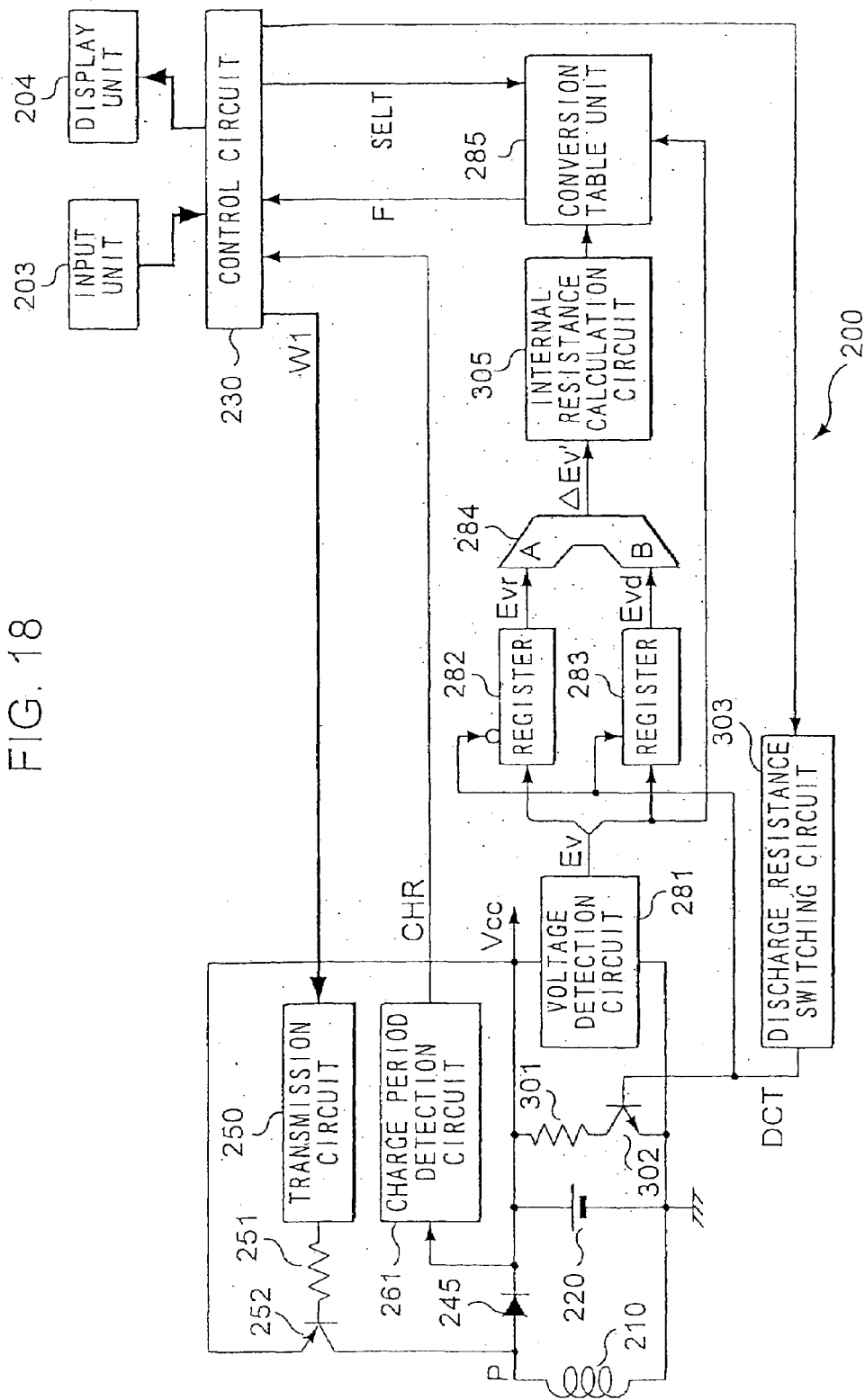
FIG. 18 is a block diagram showing a configuration of an electronic watch according to the fourth embodiment of the invention.

With reference to FIG. 18, the electronic watch 200 rectifies the signal induced in the watch-side coil 210 by the AC magnetic field, which is supplied to the secondary battery 220 as a full-duty charge pulse or a half-duty charge pulse.

During the period when the signal E remains at L level, on the other hand, the output signal of the AND gate 152 is fixed to L level and the transistor 153 remains off. As a result, the AC magnetic field is not supplied from the station-side coil 110 to the electronic watch 200, nor is the secondary battery 220 of the electronic watch 200 charged. During this period when the electronic watch 200 is not charged, the electronic watch 200 can output the AC magnetic field modulated by the data signal addressed to the station 100. During this period when signal E is at L level, one of the terminals of the station-side coil 110 is fixed to the source voltage Vcc and the other end thereof is effectively floating. When an AC magnetic field is supplied from the watch-side coil 210, therefore, a signal S2 is induced at the terminal of the station-side coil 110 connected to the drain of transistor 153. The receiving circuit 154 at the station side demodulates signal S2 to extract data signal S3 using clock CLK. During the period when signal E is at L level, the decoder 155 outputs the commands com1, com2 or com3 transmitted from the electronic watch 200 by decoding the data signal obtained by the receiving circuit 154.

The command com1 is sent from the electronic watch 200 in the case where the stored charge level of the secondary battery 220 is not saturated and still has a margin for more charging. The command com1 is supplied to the first input terminal of the OR gate 156 and the charge/transfer switch 170. The command com2, on the other hand, is for giving an instruction to switch from the half-duty charge to full-duty charge. The command com2 is supplied to the charge/transfer switch 170. The command com3 is sent from the electronic watch 200 in the case where the secondary battery 220 is fully charged and has no margin for further charging since the charging capability thereof is saturated (hereinafter referred to as "fully-charged state"). The command com3 is supplied to the second input terminal of the OR gate 156 and the third input terminal of the OR gate 157.

The charge start button 103$_1$ and the transfer start button 103$_2$, when depressed by the user, output a one-shot pulse signal, respectively. The pulse signal output from either of the two buttons is supplied as a pulse signal STR to the timers 141 and 142 through the OR gate 105. Also, the pulse signal output from the charge start button 103$_1$ is supplied as a pulse signal CS to the charge/transfer switch 170.

A preset value M is written in the timer 141 by the pulse signal STR. Subsequently, the timer 141 counts down in response to the clock signal CLK with the count of the preset value M as an initial value. The timer 141 continues to count down until the count becomes "0", and during the count operation, outputs the H-level signal A. The preset value M is set to such a value as to maintain the H level of the signal A for 12 hours, for example. The signal A whose level is inverted by an inversion circuit 143 is supplied to the second input terminal of the OR gate 157 and a processing circuit 130.

Also, the preset value N is written in the timer 142 by the pulse signal STR. Then, the timer 142 continues to count down from the preset value N to 0 according to the clock signal CLK. During the count operation, the timer 142 outputs a H-level signal B. The preset value N is set to a level sufficiently smaller than M so that the H-level period of the signal B is 30 minutes, for example.

The command detector 160 monitors the output signal of the decoder 155 through the OR gate 156 during the period when the signal B maintains the H level after the pulse signal STR is output. In the case where the command com1 or com3 is not output from the decoder 155 before the end of this period, the H-level signal D is output. This signal D is supplied to the first input terminal of the OR gate 157 and the processing circuit 130.

The charge/transfer switch 170 determines whether the pulse signal CS is output or not when the pulse signal STR is output from the OR gate 105. In the case where the pulse signal CS is output together with the pulse signal STR, the charge/transfer switch 170 determines that the charge instruction is given by the depression of the charge start button $103_1$, and starts the charge control processing described below. The charge control processing, however, is performed on condition that the output signal OFF of the OR gate 157 is at L level.

Figure 16:
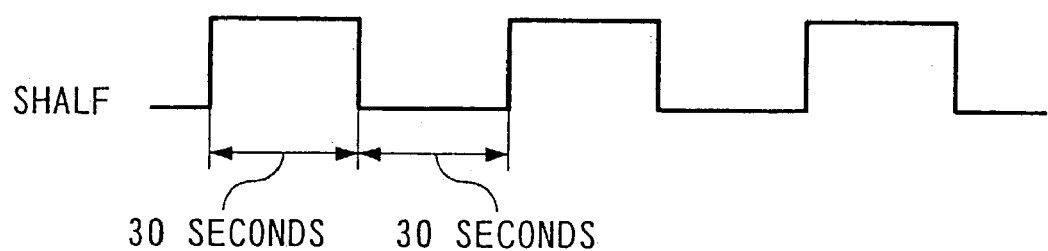
FIG. 16 is a diagram showing a waveform of a half-duty charge command signal according to the fourth embodiment of the invention.

First, the charge/transfer switch 170 generates a half-duty charge command signal SHALF having a duty factor of 50% and a period of 60 seconds as shown in FIG. 16, which command signal SHALF is output as signal E.

Figure 17:
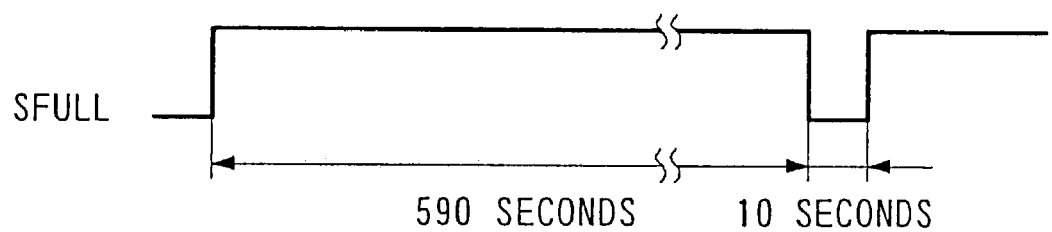
FIG. 17 is a diagram showing a waveform of a full-duty charge command signal according to the fourth embodiment of the invention.

Then, when the command com2 is output from the decoder 155, the charge/transfer switch 170 generates a full-duty charge command signal SFULL and outputs it as a signal E. The full-duty charge command signal SFULL has a duty factor of 98.3% and alternates between H level of 590 seconds and L level of 10 seconds as shown in FIG. 17.

In the case where the output signal OFF of the OR gate 157 is at H level, on the other hand, the charge/transfer switch 170 fixes the signal E to L level and thereby prohibits the generation of an AC magnetic field by the station-side coil 110. Now, an explanation will be given of the case in which the signal OFF assumes H level and the generation of the AC magnetic field is prohibited on the one hand and the reason why the generation of the AC magnetic field is prohibited in such a case.

First, as a case in which the generation of the AC magnetic field is prohibited, it is considered that the electronic watch 200 is not fully accommodated in the station 100 and the station-side coil 110 and the watch-side coil 210 are not in opposed relation to each other. In such a case, there is no communication link for connecting the station 100 and the electronic watch 200. Even in the case where the charge start button $103_1$ or the transfer start button $103_2$ is depressed, therefore, the command com1 or com3 fails to reach the station 100 from the electronic watch 200, so that the timer 142 terminates the count down, and the H-level signal D is output from the command detector 160, with the result that the signal OFF turns H.

In the case where the signal D turns H in this way, the station-side coil 110 is prohibited from generating an AC magnetic field by reason of the fact that even if an AC magnetic field is generated from the station-side coil 110 when the station-side coil 110 and the watch-side coil 210 are not in opposed relation to each other, no AC voltage would be induced in the watch-side coil 210 resulting in the waste of power consumption.

The action is taken to prohibit the generation of the AC magnetic field after awaiting the receipt of command com1 or com3 for 30 minutes by the count of the timer 142 considering the situation in which the remaining charge in the secondary battery 220 of the electronic watch 200, which is situated in the station 100, is substantially zero. Specifically, in such a case as this, since the charge of the secondary battery 220 is substantially zero, the electronic watch 200 situated in the station 100 cannot send a command to the station 100, even though the station-side coil 110 and the watch-side coil 210 are placed in opposed relation to each other. After the charging operation of even as short as 30 minutes, however, the charge of the secondary battery 220 is considered to reach a sufficient value to send a command to the station 100 from the electronic watch 200. According to this embodiment, therefore, the receipt of the command com1 or com3 is monitored while counting 30 minutes on the timer 142, and in the case where the command com1 or com3 fails to arrive within 30 minutes, it is determined that the station-side coil 110 and the watch-side coil 210 are not placed in opposed relation to each other and the generation of the AC magnetic field by the station-side coil 110 is halted.

The generation of an AC magnetic field is also prohibited, for example, in the case where the timer 141 finishes the count of 12 hours after an instruction is given to start charging by the depression of the charge start button $103_1$ and the signal A reaches L level. The generation of an AC magnetic field by the station-side coil 110 is prohibited upon the lapse of 12 hours in this way is by reason of the fact that if the charge operation for as along as 12 hours generally charges the secondary battery 220 to the full, and a further charge operation would deteriorate the performance of the secondary battery 220. However, there is one exception to this rule. Specifically, even when the signal A reaches L level, as long as the command com1 continues to be output from the decoder 155, the charge/transfer switch 170 generates the full-duty charge command signal SFULL and outputs it as a signal E. As long as the command com1 indicating insufficient charge in the secondary battery 220 is being sent, the charge operation cannot be stopped even after 12 hours.

Also in the case where the command com3 is output from the decoder 155 and the signal OFF is at H level, the generation of the AC magnetic field is prohibited. If the charge operation is continued in spite of the fact that the command com3 instructing the charge operation to end is sent from the electronic watch 200, the second battery 220 would be deteriorated.

The station 100 according to this embodiment has been described in detail above.

FIG. 18 is a block diagram showing a configuration of the electronic watch 200 according to this embodiment.

In FIG. 18, the watch-side coil 210 has the dual function of transmitting the signal modulated by the command or the data to the station 100 under the control of the control circuit 230 and generating an AC voltage corresponding to the AC magnetic field supplied from the station 100.

The transmission circuit 250, the resistor 251 and the transistor 252 make up a transmission unit for transmitting the signal from the watch-side coil 210. The transistor 252 has the emitter thereof connected to the positive terminal of the secondary battery 20 and the collector thereof grounded through the watch-side coil 210. Upon receipt of a command or data addressed to the station 100 from the control circuit 230, the transmission circuit 250 converts the command and data into serial data having a series of bits. When the bits to be transmitted are at L level, for example, the transmission circuit 250 supplies the transistor 252 with the AC base current having a predetermined frequency and a predetermined sustaining time while, when the bits to be transmitted are at H level, on the other hand, the supply of the base current to the transistor 252 is suspended for a predetermined length of time. As a result, the AC magnetic field modulated by the serial data addressed to the station 100 is generated by the watch-side coil 210. In the case where the watch-side coil 210 sends no signal, the transmission circuit 250 suspends the base current to the transistor 252 to thereby maintain the transistor 252 in the off state.

Now, an explanation will be given of a circuit configuration in which the AC magnetic field is received from the station 100 by the watch-side coil 210 and the secondary battery 220 is charged using the electric energy obtained from the AC magnetic field.

As shown in FIG. 18, the terminal P of the watch-side coil 210 is connected to the positive terminal of the secondary battery 220 through a diode 245. The other terminal of the watch-side coil 210 is connected to the negative terminal of the secondary battery 220. As a result, upon generation of a burst-like AC magnetic field from the station-side coil 110 (FIG. 2), a burst-like AC voltage is induced in the terminal P of the watch-side coil 210 by the AC magnetic field. This AC voltage is rectified by the diode 245 and charged into the secondary battery 220 as a charge pulse. The voltage Vcc of the secondary battery 220 is used as a power supply for each part of the electronic watch 200.

A charge period detection circuit 261 detects whether an AC voltage is inducted in the terminal P, based on the voltage obtained from the cathode of the diode 245, and in the case where an AC voltage is so induced, the charge period signal CHR of H level is output, while in the case where no AC voltage is induced, the charge period signal CHR of L level is output. The voltage detection circuit 281 detects the voltage value between the terminals of the secondary battery 220, and outputs it as a digital data Ev.

The electronic watch 200 according to this embodiment includes a circuit for determining the internal resistance of the secondary battery 220. This circuit will be explained below.

First, the positive terminal of the secondary battery 220 is connected to an end of the discharge resistor 301 of a resistance value R, and the other terminal of the resistor 301 is connected to the collector of the transistor 302. The emitter of the transistor 302 is connected to the negative terminal of the secondary battery 220. When the transistor 302 is in on state, the transistor 302 and the resistor 301 form a discharge path of the secondary battery 220.

A discharge resistance switching circuit 303 outputs a signal DTC for switching between the on/off state of transistor 302 and writing data in the registers 282 and 283 under the control of the control circuit 230. More specifically, the control circuit 230 sends a command to the discharge resistance switching circuit 303 and raises the signal DTC to H level upon the lapse of a predetermined time from the change of the charge period signal CHR from H to L level. The leading edge of the signal DTC causes the output data of the voltage detection circuit 281 representing the voltage value Evd of the secondary battery 220 at the particular time point to be written in the register 283.

When the signal DTC turns H, the transistor 302 is turned on. The discharge resistor 301 is connected in parallel to the secondary battery 220 thereby to form a discharge path. Upon the lapse of a predetermined time length following the formation of the discharge path of the secondary battery 220 in this way, the control circuit 230 sends a command to the discharge resistance switching circuit 303 to reduce the signal DTC to L level. The falling edge of the signal DTC causes the output data of the voltage detection circuit 281 at this time point to be written in the register 282.

As described above, during the period when no charge operation is performed, the terminal voltage value Evd of the secondary battery 200 in open state and the terminal voltage value Evr of the secondary battery 220 with the discharge resistor 301 connected in parallel are determined. The former is held in the register 283, and the latter in the register 282.

A subtractor 284 subtracts the voltage value Evr held in the register 282 from the voltage value Evd held in the register 283, and outputs the result ΔEv. This ΔEv corresponds to the voltage drop across the internal resistance of the secondary battery 220.

An internal resistance calculation circuit 305 calculates the internal resistance value Re of the secondary battery 220 from the following equation based on the output data ΔEv of the subtractor 284, the voltage value Evr providing the output data of the register 282 and the resistance value R of the discharge resistor 301.

$$Re = R \cdot \Delta Ev / Evr$$
$$= R \cdot (Evd - Evr)/Evr$$

The internal resistance calculation circuit 305 includes a table for classifying the magnitude of the internal resistance of the secondary battery 220, determines the class to which the internal resistance value Re thus obtained belongs, and supplies the signal indicating the class to a conversion table unit 285.

The foregoing is a detailed description of the circuit for determining the internal resistance of the secondary battery 220 according to this embodiment.

The conversion table unit 285 has the following conversion tables.

Conversion table TA: A conversion table for converting the terminal voltage value Ev of the secondary battery 220 when not being charged, or in normal operation, to its corresponding stored battery charge level F or to its corresponding battery voltage value.

Conversion table TB: A conversion table for converting the terminal voltage value Ev of the secondary battery 220 being charged by the half-duty charge pulse to its corresponding stored battery charge level F or to its corresponding battery voltage value.

Conversion table TC: A conversion table for converting the terminal voltage value Ev of the secondary battery 220 being charged by the full-duty charge pulse to its corresponding stored battery charge level F or to its corresponding battery voltage value.

With the degeneration of the secondary battery and the resulting increase in the internal resistance thereof, the relation between the terminal voltage value Ev and the battery charge level F or the battery voltage value of the secondary battery undergoes a change. In view of this, the conversion table unit 285 according to this embodiment has the conversion tables TA, TB and TC corresponding to the respective classes of the internal resistance.

The conversion table unit 285 is supplied by the control circuit 230 with a signal SELT for designating one of the conversion tables TA, TB and TC. The conversion table unit 285 provides the control circuit 230 with a conversion table corresponding to the class of the internal resistance designated by the internal resistance calculation circuit 305 and having the type designated by the signal SELT.

The control circuit 230 is a sort of central processing unit having a temporary storage unit and a calculation unit. The main control operations performed by this control circuit 230 include the following. First, the control circuit 230 performs the control operation for causing the electronic watch 200 to function as a watch, or specifically the control operation for counting and the display unit 204 to display the current time. Also, in the case where an instruction by the user is input from the input unit 203, a control operation responsive to the instruction is performed. Further, the control circuit 230 performs the control operation for determining the level of the stored battery charge in the secondary battery 200 and the control operation for displaying the battery charge level at appropriate regular time intervals. This control operation is implemented differently when in normal operation mode such that no charge operation is performed, than when the charge operation is being performed. Also, the control circuit 230 performs the control operation for transmitting a command for charge control to the station 100 at regular time intervals during the charge operation. To avoid duplication, the contents of these control operations of the control circuit 230 will be described in detail later when the operation is explained according to this embodiment.

Now, the operation of this embodiment will be explained.

First, an explanation will be given of the operation of the electronic watch 200 when no charge operation is performed, i.e. when in normal operation. In the case where the battery charge level or the battery voltage value is to be displayed, the control circuit 230 sends a select signal SELT for designating a conversion table group TA corresponding to the no-charge operation, or normal operation, to the conversion table unit 285. One of the conversion tables included in the conversion table group TA is specified by the select signal SELT and a signal indicating the class of the internal resistance output from the internal resistance calculation circuit 305. According to the conversion table TA thus specified, the terminal voltage value Ev of the secondary battery 220 obtained from the voltage detection circuit 281 is converted to its corresponding battery charge level F or its corresponding voltage value. The control circuit 230 displays the battery charge level F or the battery voltage value obtained from the conversion table TA on the display unit 204.

Now, an explanation will be given of the operation of the electronic watch 200 and the station 100 at the time of charge operation.

First, the user places the electronic watch 200 in the depression 101 of the station 100. As a result, the station-side coil 110 and the watch-side coil 210 are placed in opposed relation to each other as shown in FIG. 2 and are therefore electromagnetically coupled to each other.

After that, when the user depresses the charge start button $103_1$, a pulse signal STR as shown in FIG. 15 is generated and the timers 141 and 142 begin the count operation.

Due to the pulse signal STR, on the other hand, the charge/transfer switch 170 outputs the half-duty charge command signal SHALF as a signal E. This signal E alternates between a H-level period of 30 seconds and a L-level period of 30 seconds as shown in FIG. 16. During the time when the signal E remains at H level, the transistor 153 is switched, and a burst-like AC magnetic field is intermittently generated from the station-side coil 110.

The generation of the AC magnetic field induces an AC voltage in the watch-side coil 210 of the electronic watch 200, which voltage is rectified by the diode 245. The resulting half-duty charge pulse is applied to the secondary battery 220 thereby to charge the secondary battery 220.

The charge period detection circuit 261 monitors whether an AC voltage is induced in the watch-side coil 210 through the diode 245, and during the period when the AC voltage is induced, maintains the charge period signal CHR at H level, while the charge period signal is maintained at L level during the time when no AC voltage is induced.

Once this H/L level switching operation of the charge period signal CHR is started, the control circuit 230 detects that the secondary battery 220 began to be charged, and by the inherent clock function thereof, determines the charge start time and stores it in a memory built in the control circuit 230.

Until the lapse of four hours from the charge start time, the control circuit 230 determines the battery charge level F or the battery voltage value at appropriate regular time intervals and displays it on the display unit 204. This is explained specifically below.

First, the control circuit 230 sends a select signal SELT designating the conversion table group TB corresponding to the half-duty charge to a conversion table unit 285. One of the conversion tables included in the conversion table group TB is specified by the select signal SELT and the signal output from the internal resistance calculation circuit 305 indicating the class of the internal resistance.

According to the conversion table TB thus specified, the terminal voltage value Ev of the secondary battery 220 obtained from the voltage detection circuit 281 is converted to its corresponding battery charge level F or its corresponding battery voltage value.

The battery charge level F or the battery voltage value obtained from the conversion table TB is displayed on the display unit 204 by the control circuit 230.

The aforementioned operation is periodically repeated until the lapse of four hours from the charge start.

Upon the lapse of four hours from the charge start, the control circuit 230 sends the data bits of the command com2 to the transmission circuit 250 within the period when the charge period signal CHR remains at L level, i.e. within the period when the burst-like AC magnetic field is not generated in the station-side coil 110, and the AC magnetic field modulated by the data bits is output from the watch-side coil 210.

In the station 100, an AC voltage is induced by the AC magnetic field in the station-side coil 110. In the receiving circuit 154, the data bits of the command com2 are demodulated from this AC voltage and the command com2 is output by the decoder 155.

The charge/transfer switch 170, upon receipt of the command com2, outputs the full-duty charge command signal SFULL as a signal E in place of the half-duty charge command signal SHALF thus far output. As shown in FIG. 17, this signal E alternates between the H level period of 590 seconds and the L level period of ten seconds. Only during the period when this signal E remains at H level is the switching operation of the transistor 153 is carried out. As a result, the burst-like AC magnetic field is intermittently generated by the station-side coil 110.

In the electronic watch 200, the full-duty charge pulse is generated by the burst-like AC magnetic field thereby to charge the secondary battery 220.

The control circuit 230 determines the battery charge level F or the battery voltage value at appropriate regular time intervals and displays it on the display unit 204. In this case, however, the control circuit 230 sends the select signal SELT designating the conversion table group TC corresponding to the fully-duty charge to the conversion table unit 285. One of the conversion tables included in the conversion table group TC is specified by the select SELT signal and the signal indicating the class of the internal resistance output from the internal resistance calculation circuit 305. According to the conversion table TC thus specified, the terminal voltage value Ev of the secondary battery 220 obtained from the voltage detection circuit 281 is converted to its corresponding battery charge level F or its corresponding battery voltage value. The control circuit 230 displays the battery charge level F or the battery voltage value obtained from the conversion table TC on the display unit 204.

While the charge operation or the operation of displaying the battery charge is performed in this way, the control circuit 230 continues to monitor the battery charge level F or the battery voltage value. The control circuit 230, upon determination that the secondary battery 220 has become fully charged up, sends the data bits of the command com3 to the transmission circuit 250 during the period when the charge period signal CHR is at L level, and the AC magnetic field modulated by the data bits is output from the watch-side coil 210.

As a result, in the station 100, the command com3 is output from the decoder 155 and the signal OFF turns H.

The charge/transfer switch 170, upon receipt of the H-level signal OFF, reduces the signal E to L level thereby to stop the generation of the AC magnetic field by the station-side coil 110. As a result, the charging of the secondary battery 220 of the electronic watch 200 is terminated.

Upon the lapse of 12 hours from the charge start, the timer 141 on the station 100 terminates the count operation. The secondary battery 220 may not be fully charged even at the time when the count operation is to be terminated. To cope with such a case, the control circuit 230 of the electronic watch 200 according to this embodiment sends the command com1 to the station 100 upon the lapse of 12 hours from charge start. In the station 100, the command com1 is output from the decoder 155. In this case, the charge/transfer switch 170 outputs the full-duty charge command signal SFULL as a signal E and the full-duty charge operation is continued even if the timer 141 terminates the count operation and the signal OFF turns H.

Also, there may be a case in which the user removes the electronic watch 200 from the station 100 before the secondary battery 220 is fully charged. In such a case, the station 100 cannot receive the command com3. Upon the lapse of 12 hours from charge start, however, the count operation of the timer 141 is terminated, and the signal OFF turns H. As a result, the charge/transfer switch 170 fixes the signal E to L level and stops generating the AC magnetic field for charging.

FIG. 19 is a table summarizing the operation according to this embodiment described above.

The extreme left column of the table contains the description of six types of terminal voltage value Ev for no-charge operation or normal operation with the description of the battery charge level F corresponding to each terminal voltage in parenthesis. The next column contains the description of the level corresponding to each terminal voltage Ev described on the left side. At the time of no-charge or in normal operation, the battery charge level F or the battery voltage value is estimated from the terminal voltage value Ev using the table showing the correspondence (the conversion table TA described above) between the terminal voltage value Ev and the battery charge level F or the battery voltage value. The result of this estimation is displayed by an icon visually expressing the remaining charge of the battery. The third column of the table has such an icon displayed in the display unit 204 of the electronic watch 200 in this way. In addition to the icon, the remaining number of days during which the electronic watch 200 can be still used without charging the secondary battery 220 is displayed on the display unit 204 in such a form as "still usable for 22 days" when the level of the terminal voltage value Ev is "15" or "still usable for 14 days" when the level of the terminal voltage value Ev is "12".

In the case where the half-duty or full-duty charge operation is being carried out, on the other hand, a dedicated correspondence table (the conversion table TB or TC described above) is used to estimate the battery charge level F or the battery voltage value from the terminal voltage value Ev, and the estimation result is displayed as an icon. In this case, the table used for estimating the battery charge level F is different from the one used for the no-charge operation or normal operation. Even with the same terminal voltage value Ev, therefore, a different icon is displayed for indicating the remaining charge. In FIG. 19, four types of icon are assigned codes SB1 to SB4 to clarify the difference.

[7] Modification of Fourth Embodiment

In the embodiments described above, the command com2 for requesting the switching from the half-duty charging operation to the full-duty charging operation was sent to the station 100 from the control circuit 230 of the electronic watch 200 upon the lapse of four hours from the charge start time. Instead of switching the charging method at the set time, however, the command com2 may be transmitted from the control circuit 230 to the station 100 when the battery charge level F or the terminal voltage value Ev of the secondary battery 220 reaches a preset value.

Also, the electronic watch may be configured in such a manner as to select, by operating the input unit 203, the desired one of two modes, one for transmitting the command com2 upon the lapse of four hours after charge start, and the other for transmitting the command com2 when the battery charge level F or the terminal voltage value Ev reaches a predetermined value.

According to the above-mentioned embodiments, the duty factor of the charge signal is changed in two stages. As an alternative, the charge signal may be changed in three stages.

In such a case, three or more conversion tables are provided for estimating the charge level F.

The embodiments described above refer to the case in which the station 100 is assumed to be a charging device and the electronic watch 200 to be a charged device. The invention, however, is applicable to all the chargeable electronic apparatuses and chargers therefor. Examples include an electric tooth brush, electric shaver, cordless telephone, portable telephone, personal handy phone, mobile personal computer, PDA (personal digital assistants, i.e. personal information terminal) and the like charged devices having a secondary battery, and the charging devices therefor.

The invention claimed is:
1. An electronic apparatus comprising:
a chargeable power supply unit;
a display unit supplied with power from said power supply unit;
a voltage detection unit for detecting an output voltage of said power supply unit;
a display prohibition unit for prohibiting a display on said display unit when the output voltage of said power supply unit detected by said voltage detection unit is dropping and drops to a first predefined voltage;
an initialization unit for performing an initialization process when the output voltage of said power supply unit detected by said voltage detection unit is dropping and drops to a second predefined voltage lower than said first predefined voltage; and a display permission unit for permitting said display on said display unit when the output voltage of said power supply unit detected by said voltage detection unit is rising, reaches said second voltage and then rises a third predefined voltage not lower than said first predefined voltage.

2. An electronic apparatus according to claim 1, further comprising:

an information storage unit for storing at least one of system information and watch information and for providing the system information or watch information to a control unit of said electronic apparatus;

wherein said second predefined voltage is set to a voltage value not lower than a minimum voltage necessary for storing and holding said system information or said watch information in said information storage unit.

3. An electronic apparatus as described in claim 1, further comprising:

a nonvolatile storage unit for storing at least one of system information and watch information; and an information storage unit for selectively storing said system information or said watch information, and for providing the system information or watch information to a control unit of said electronic apparatus;

wherein said initialization unit performs the initialization process by transferring said system information or said watch information to said information storage unit from said nonvolatile storage unit.

4. An electronic apparatus comprising:

a chargeable power supply unit;

a display unit supplied with power from said power supply unit;

a charge detection unit for determining whether said power supply unit is being charged or not being charged;

a voltage detection unit for detecting an output voltage of said power supply unit;

a display prohibition unit for prohibiting a display on said display unit when the output voltage of said power supply unit detected by said voltage detection unit is dropping and drops to a first predefined voltage; and an initialization unit for performing an initialization process when the determination result of said charge detection unit and the detection result of said voltage detection unit meet predetermined conditions following the prohibiting of said display on said display.

5. An electronic apparatus according to claim 4, wherein said initialization unit performs the initialization process when said charge detection unit determines that said power supply unit is being charged and said voltage detection unit detects that the output voltage of said power supply unit has reached a second predefined voltage not lower than said first predefined voltage, following the prohibiting of said display on said display unit.

6. An electronic apparatus according to claim 5, further comprising a display permission unit for permitting said display on said display unit when said initialization unit performs the initialization process.

7. An electronic apparatus according to claim 5, further comprising a display permission unit for permitting said display on said display unit when the output voltage of said power supply unit detected by said voltage detection unit reaches a third predefined voltage not lower than said second predefined voltage, following the initialization process by said initialization unit.

8. An electronic apparatus according to claim 4, wherein said initialization unit performs the initialization process when, after display said prohibition unit prohibits said display on said display unit, said charge detection unit determines that said power supply unit is being charged and said voltage detection unit detects that the output voltage of said power supply unit is kept not lower than a second predefined voltage not lower than said first predefined voltage for not less than a predetermined length of time.

9. An electronic apparatus according to claim 8, further comprising a display permission unit permitting said display on said display unit when said initialization unit performs said initialization process.

10. An electronic apparatus according to claim 8, further comprising a display permission permitting said display on said display unit when the output voltage of said power supply unit detected by said voltage detection unit reaches a third predefined voltage not lower than said second predefined voltage, after said initialization unit performs said initialization process.

11. A method of controlling an electronic apparatus comprising a chargeable power supply unit and a display unit supplied with power from said power supply unit, the method comprising the steps of:

prohibiting a display on said display unit when the output voltage of said power supply unit reaches a first predefined voltage;

performing an initialization process when the output voltage of said power supply unit reaches a second predefined voltage lower than said first predefined voltage; and permitting said display on said display unit when the output voltage of said power supply unit reaches said second predefined voltage and then reaches a third predefined voltage not lower than said first predefined voltage.

* * * * *